(12) United States Patent
Kley

(10) Patent No.: US 6,232,597 B1
(45) Date of Patent: May 15, 2001

(54) SCANNING PROBE MICROSCOPE ASSEMBLY AND METHOD FOR MAKING CONFOCAL, SPECTROPHOTOMETRIC, NEAR-FIELD, AND SCANNING PROBE MEASUREMENTS AND ASSOCIATED IMAGES

(75) Inventor: Victor B. Kley, Berkeley, CA (US)

(73) Assignee: General Nanotechnology, LLC, Berkeley, CA (US)

( * ) Notice: Subject to any disclaimer, the term of this patent is extended or adjusted under 35 U.S.C. 154(b) by 0 days.

(21) Appl. No.: 09/659,538

(22) Filed: Sep. 11, 2000

Related U.S. Application Data

(62) Division of application No. 09/249,567, filed on Feb. 9, 1999, which is a continuation of application No. 08/885,014, filed on Jul. 1, 1997, now Pat. No. 6,144,028, which is a continuation of application No. 08/412,380, filed on Mar. 29, 1995, now abandoned, and a continuation-in-part of application No. 08/281,883, filed on Jul. 28, 1994, now abandoned.

(51) Int. Cl.$^7$ .................................................. H01J 31/00
(52) U.S. Cl. ..................... 250/234; 382/286; 250/306; 250/307
(58) Field of Search ................................ 250/234, 235, 250/236, 306, 307, 310, 311; 356/373, 375, 376; 382/286, 289, 291

(56) References Cited

U.S. PATENT DOCUMENTS 5,756,997  *  5/1998  Kley ..................................... 250/306
6,144,028  *  11/2000  Kley ..................................... 250/234

* cited by examiner

Primary Examiner—John R. Lee
(74) Attorney, Agent, or Firm—Townsend and Townsend and Crew LLP

(57) ABSTRACT

A scanning probe microscope assembly and corresponding method for making confocal, spectrophotometric, near-field, and scanning probe measurements and forming associated images from the measurements.

8 Claims, 29 Drawing Sheets

| Display Routines | 136 |
|---|---|
| Display Formatting Routine | 520 |
| Color Mapping Tool Routine | 521 |
| 3D Surface Measuring Tool Routine | 532 |
| 3D Volume Measuring Tool Routine | 544 |
| 2D Measuring Tool Routine | 548 |
| 2D Angle Measuring Tool Routine | 552 |
| FFT Routine | 560 |

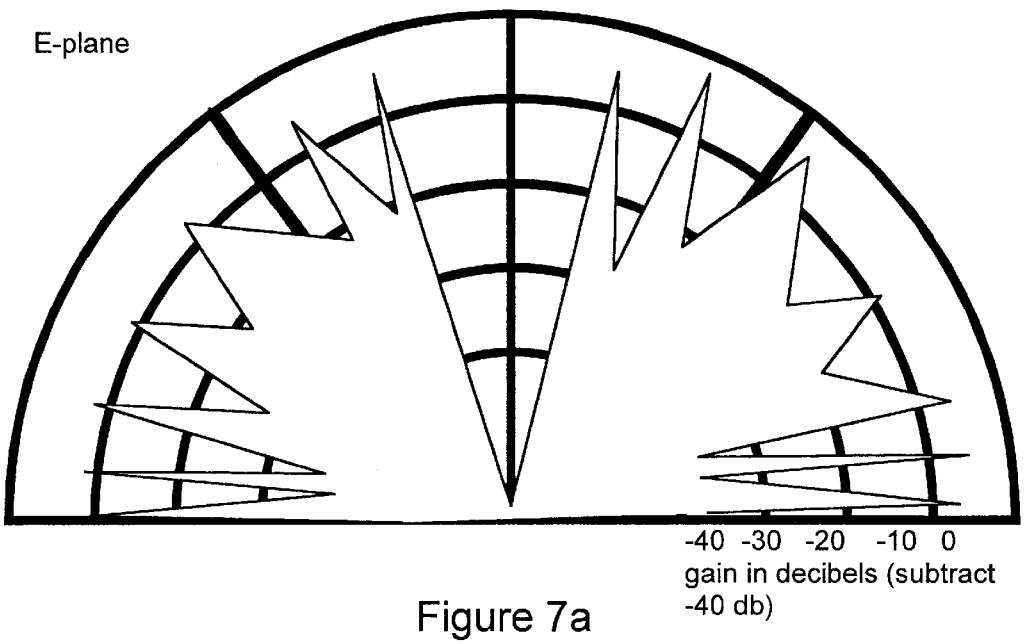
Figure 7a  gain in decibels (subtract -40 db)
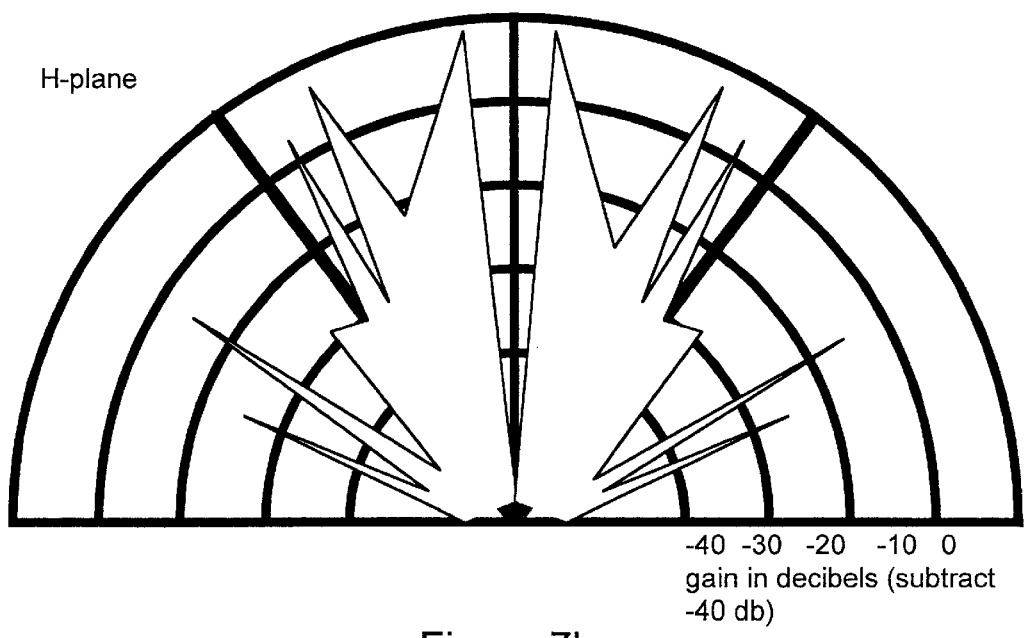
Figure 7b  gain in decibels (subtract -40 db)

| Display Routines | 136 |
|---|---|
| Display Formatting Routine | 520 |
| Color Mapping Tool Routine | 521 |
| 3D Surface Measuring Tool Routine | 532 |
| 3D Volume Measuring Tool Routine | 544 |
| 2D Measuring Tool Routine | 548 |
| 2D Angle Measuring Tool Routine | 552 |
| FFT Routine | 560 |

SCANNING PROBE MICROSCOPE ASSEMBLY AND METHOD FOR MAKING CONFOCAL, SPECTROPHOTOMETRIC, NEAR-FIELD, AND SCANNING PROBE MEASUREMENTS AND ASSOCIATED IMAGES

This is a divisional of U.S. patent application Ser. No. 09/249,567, filed on Feb. 9, 1999, which is a continuation of U.S. patent application Ser. No. 08/885,014, filed on Jul. 1, 1997 now U.S. Pat No. 6,144,028, which is a continuation of U.S. patent application Ser. No. 08/412,380, filed on Mar. 29, 1995, now abandoned, which incorporates by reference and is a continuation-in-part of U.S. patent application Ser. No. 08/281,883, filed on Jul. 28, 1994, now abandoned.

This document includes a microfiche appendix. The microfiche appendix has one page of microfiche with 61 frames.

FIELD OF THE INVENTION

The present invention relates generally to spectrophotometry, near-field microscopy, confocol microscopy, and scanning probe microscopy. Specifically, it relates to a scanning probe microscope assembly and corresponding method for making confocal, spectrophotometric, near-field, and scanning probe measurements and forming associated images from the measurements.

BACKGROUND OF THE INVENTION

In the past, near-field optical microscopes, such as those described in U.S. Pat. No. 4,604,520, have incorporated spectrophotometer in order to obtain information about the composition of the specimen being examined. However, they are plagued by the extremely slow rate at which the specimen area can be scanned. This problem has severely limited the use of near-field optical microscopes and spectrophotometer for commercially important applications in the biological and industrial fields. In addition, near-field optical microscopes can not achieve the resolution of scanning probe microscopes.

On the other hand conventional scanning probe microscopes, such as scanning tunneling microscopes and atomic force microscopes, have been able to make only limited determinations of the constituents of an object under inspection. Moreover, these conventional scanning probe microscopes cannot define the structure of the object below its surface and cannot define with fine resolution pits, walls, projections, and other structures which prevent the end of the probe tip from coming close enough to the object in these areas for accurate inspection by conventional scanning probe microscopy.

U.S. Pat. No. 5,319,977 describes a scanning probe microscope that utilizes the probe tip to make acoustic microscopy measurements and either atomic force microscopy (AFM) measurements or scanning tunneling microscopy (STM) measurements during the same scanning sequence. The resolution of acoustic microscopy is however rather low in comparison to AFM, STM, or near-field optical microscopy. Moreover, as with conventional scanning probe microscopes, the scanning probe microscope described in U.S. Pat. No. 5,319,977 cannot define those types of structures which prevent the end of the probe tip from coming close enough to the object for accurate inspection.

Furthermore, many objects exhibit areas of varying composition and conductivity. For example, the surface of a semiconductor may change from being conductive to insulative as a function of position. However, no scanning probe microscopes currently exist which are capable of making STM, AFM, near-field optical microscopy, and spectrophotometric measurements during the same scanning sequence in order to properly image and identify such an object.

Moreover, in the past microscope systems for Confocal or Scanning Probe Microscopy have been limited in the tools available for manipulating the 2D, 3D and volume image characteristics they generate.

In addition, they have been limited in the ability (particularly in Scanning Probe Microscopy) to make accurate measurements in x,y, and z directions. In particular it is useful to have accurate position feedback when operating a Scanning Probe Microscope in order to close the control loop in positioning and repositioning the Scanning Probe.

Furthermore the collection of sectional data in volume confocal microscopy has taken substantial amounts of time making some measurements of time varying specimens difficult or impossible.

SUMMARY OF THE INVENTION

The foregoing problems are solved by a scanning probe microscope assembly that has an AFM mode, an STM mode, a near-field spectrophotometry mode, a near-field optical mode, and a confocol microscopy mode for examining an object.

The scanning probe microscope assembly includes a probe having a base. The probe also includes a cantilever connected to the base, a tip connected to the cantilever, and a clamp connected to the base.

The scanning probe microscope assembly is configured to induce atomic force interaction between the tip and the object and to detect deflection of the cantilever due to the atomic force interaction during the AFM.

The scanning probe microscope assembly is also configured to induce and detect a tunneling current between the tip and the object during the STM mode. During the STM mode, the cantilever is held rigid with respect to the base.

The scanning probe microscope assembly includes a spectrophotometer which has a light source optically coupled to the tip. The light source is controlled to provide light to the tip during the spectrophotometry mode. The tip is shaped so that it emits the provided light at the sharp end of the tip. The emitted light then optically interacts with the object. The spectrophotometer includes a photodetector for detecting light that results from the emitted light optically interacting with the object in order to make spectrophotometric measurements of the detected light.

The scanning probe microscope assembly is also configured to rotationally polarize the light provided by the light source of the spectrophotometer during the near-field mode. The scanning probe microscope assembly identifies deep surface features based on the light detected by the photodetector that results from the rotationally polarized light being emitted by the tip and optically interacting with the object.

The scanning probe microscope assembly is also configured to direct the tip to penetrate the object at a specific point with a predefined known force. The light source is controlled to provide light to the tip during the hardness testing mode before and while the tip penetrates the object. The photodetector detects the light that results from the emitted light optically interacting with the object before and while the tip penetrates the object. The scanning probe microscope assembly compares the resulting light detected before the tip penetrates the object with the resulting light detected while the tip penetrates the object to determine the hardness of the object.

BRIEF DESCRIPTION OF THE DRAWINGS

The invention will be more readily apparent from the following detailed description and appended claims when taken in conjunction with the drawings, in which:

FIGS. 7a and 7b provide electrical field plane and magnetic field plane polar plots of optical energy emissions by the tip of the scanning probe microscope assembly of FIG. 1;

FIG. 27b shows the operation of the mode shifter and lens of FIG. 27a;

DESCRIPTION OF THE FIRST EMBODIMENT

Figure 1:
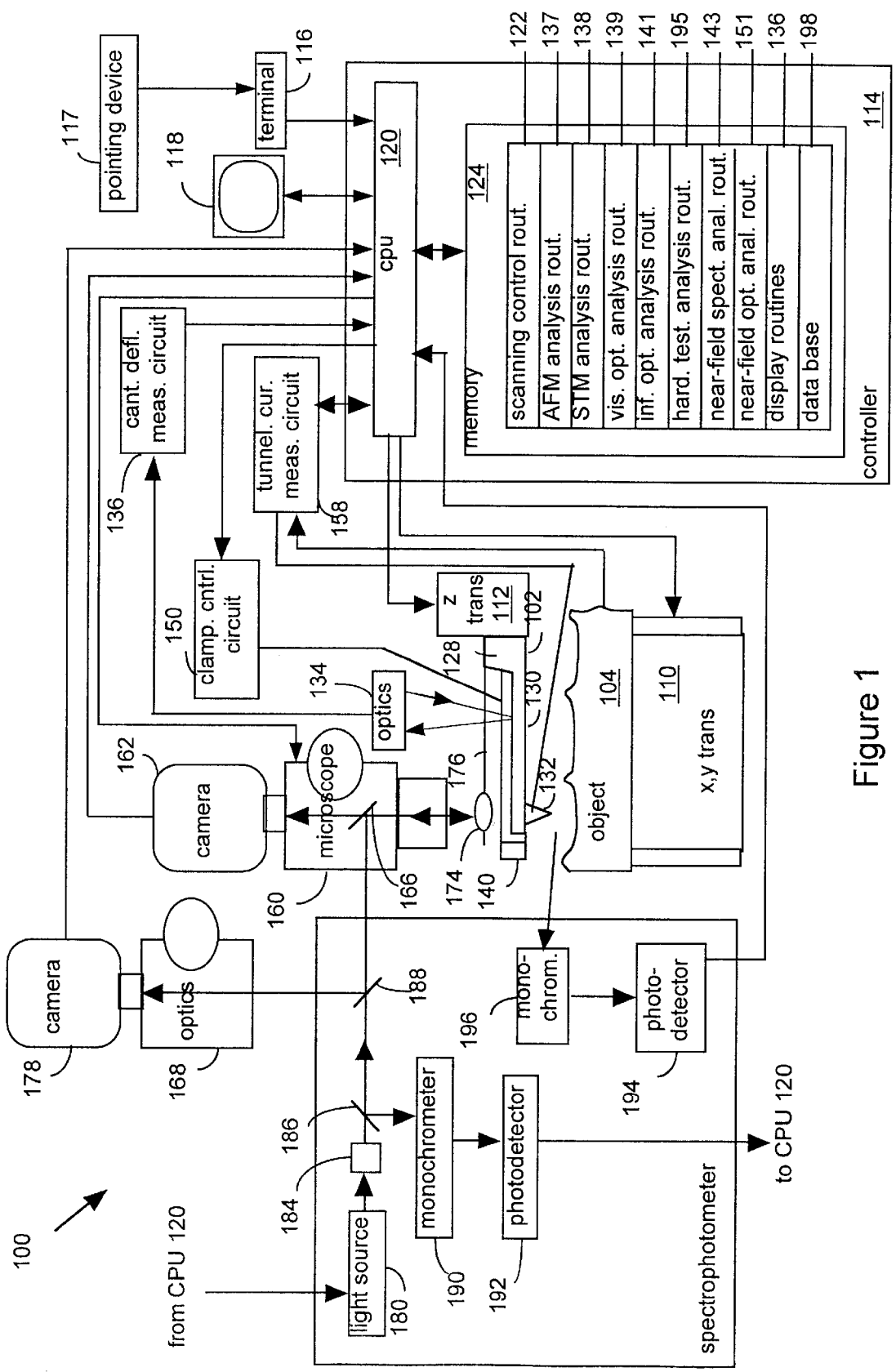
FIG. 1 shows a conceptual view of a scanning probe microscope assembly in accordance with the present invention.

Referring to FIG. 1, there is shown a conceptual diagram of one embodiment of a scanning probe microscope assembly 100 in accordance with the present invention.

A probe 102 is used to scan the surface of an object 104 in variety of measurement modes, as will be discussed shortly. In the preferred embodiment, the surface of the object 104 is scanned by probe 102 using a conventional piezoelectric XY translator 110 to move the object 104 along the X and Y axes and a conventional piezoelectric Z translator 112 to move the probe 102 along the Z axis. However, those skilled in the art will appreciate that a piezoelectric XYZ translator may be used instead to move the object 104 along the X, Y, and Z axes while the probe 102 remains stationary. Alternatively, a piezoelectric XYZ translator may be used to move the probe 102 along the X, Y, and Z axes while the object 104 remains stationary.

Scanning is controlled by controller or computer 114 based on inputs received from the control terminal 116. During scanning, controller 114 analyzes measurement data and displays measurement information on display monitor 118.

Atomic Force Microscopy Mode

Scanning probe microscope assembly 100 is configured to perform atomic force microscopy (AFM). As will be explained later, the AFM mode may occur when the user has selected the AFM mode with the control terminal 116 and also issues with the control terminal 116 a high magnification zoom control signal received by the CPU 120 for a high magnification scan of the object 104. The scanning control routine 122 stored in the memory 124 and run on the CPU 120 then generates scanning control signals outputted by the CPU 120 for controlling the XY and Z translators 110 and 112 to position probe 102 over the surface of the object 104 for AFM measurements.

Probe 102 includes a base 128 coupled to the Z translator 112, a cantilever 130 integrally connected to the base 128, and a sharp projecting tip 132 integrally connected to the cantilever 130. The scanning control signals generated by the scanning control routine 122 control the XY and Z translators 110 and 112 so that tip 132 is positioned in close proximity to or in contact with the object 104 depending on what type of force interaction between the tip 132 and the object 104 is desired. As a result, the cantilever 130 will be deflected due to atomic force interaction between the tip 132 and the object 104. As those skilled in the art know, this atomic force interaction may be due to Van der Waals forces, magnetic forces, electrostatic forces, lateral forces, or other related forces.

The deflection of the cantilever 130 representing the atomic force interaction between the tip 132 and the object 104 is optically detected by conventional optics 134. The conventional deflection measurement circuit 136 is coupled to the optics 134. It measures the optically detected deflection and outputs a deflection measurement signal containing data representing the measured deflection. The measured deflection also corresponds to the topography of the object. Thus, the optics 134 and the deflection measurement circuit 135 serve as a cantilever deflection measurer. Those skilled in the art will appreciate that other types of systems may be used to measure deflection of the cantilever 130.

The deflection measurement signal is provided to the CPU 120. The data contained by the signal is analyzed and processed by the AFM analysis routine 137 to produce AFM image data representing a high magnification (or nanoview) image of the topography of the object 104. The display routine 136 then formats the AFM image data, in the way described later, and the CPU 120 provides it to the display monitor 118 for display. The routines 136 and 137 are both stored in the memory 124 and run on the CPU 120.

Scanning Tunneling Microscopy Mode

The scanning probe microscope assembly 100 of FIG. 1 is configured also to perform scanning tunneling microscopy (STM). Like the AFM mode, the STM mode may occur when the user selects with the control terminal 116 the STM mode and also issues with control terminal 116 a high magnification zoom control signal received by the CPU 120 for a high magnification scan of the object 104. During this scan, the scanning control routine 122 generates scanning control signals outputted by the CPU 120 for controlling the XY and Z translators 110 and 112 to position probe 102 over the surface of the object 104 for STM measurements.

Figure 2A:
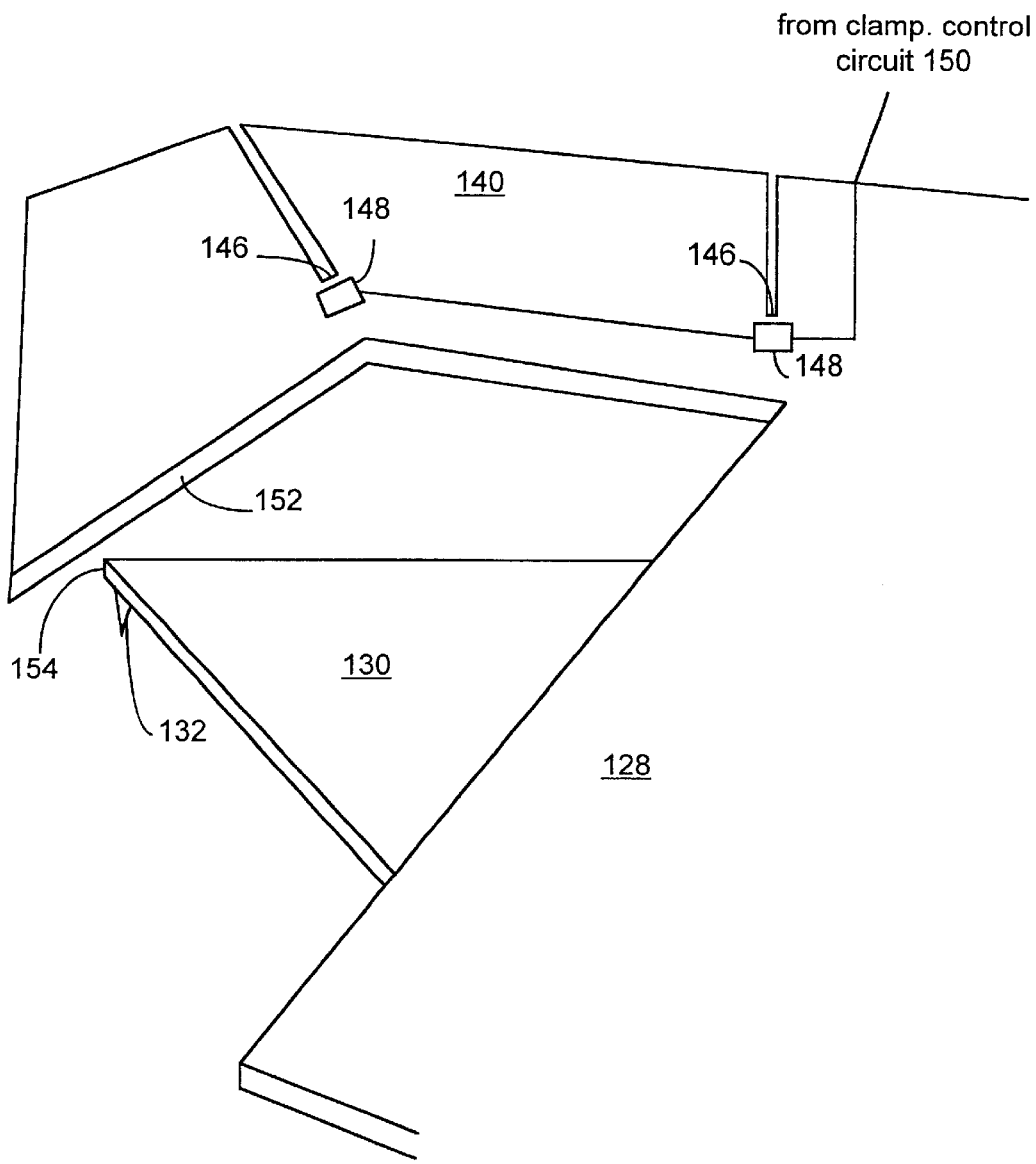
FIGS. 2a and 2b show embodiments of a clamping structure for holding rigid the cantilever of the probe of the scanning probe microscope assembly of FIG. 1 during a scanning tunneling measurement (STM) mode.

Referring to FIG. 2a, probe 102 includes, in addition to the base 128, the cantilever 130, and the tip 132, a clamp in the form of a clamping arm 140 integrally connected to the base 128. The lens system 174 and the lens system support 176 of the probe 102, which are shown in FIG. 2c and described later, are not shown in FIG. 2a for ease of illustration. The clamping arm 140 is L-shaped and extends out from the base 128 past and adjacent to the free end 142 of the cantilever 130. The clamping arm 140 has slots 144 which form action joints 146 at the closed ends of the slots 144.

In one embodiment, heating elements 148 are disposed on the clamping arm 140 at the action joints 146, as shown in FIG. 2a. Referring to FIG. 1, when the user selects the STM mode with the control terminal 116, the scanning control routine 122 generates a clamping control signal received by the clamping control circuit 150. In response, the clamping control circuit 150 generates clamping arm movement signal provided to the heating elements 148 shown in FIG. 2a. The heating elements 148 are responsive to the clamping arm movement signal and heat the action joints 146 so that the clamping arm 140 thermally expands at the action joints 146 and the free end 152 of the clamping arm 140 moves in and presses firmly against the free end 154 of the cantilever 130. As a result, the cantilever 130 in the STM mode is immobilized and held rigidly against the clamping arm 140 so that STM can be performed with tip 132, as will be described shortly.

Figure 2B:
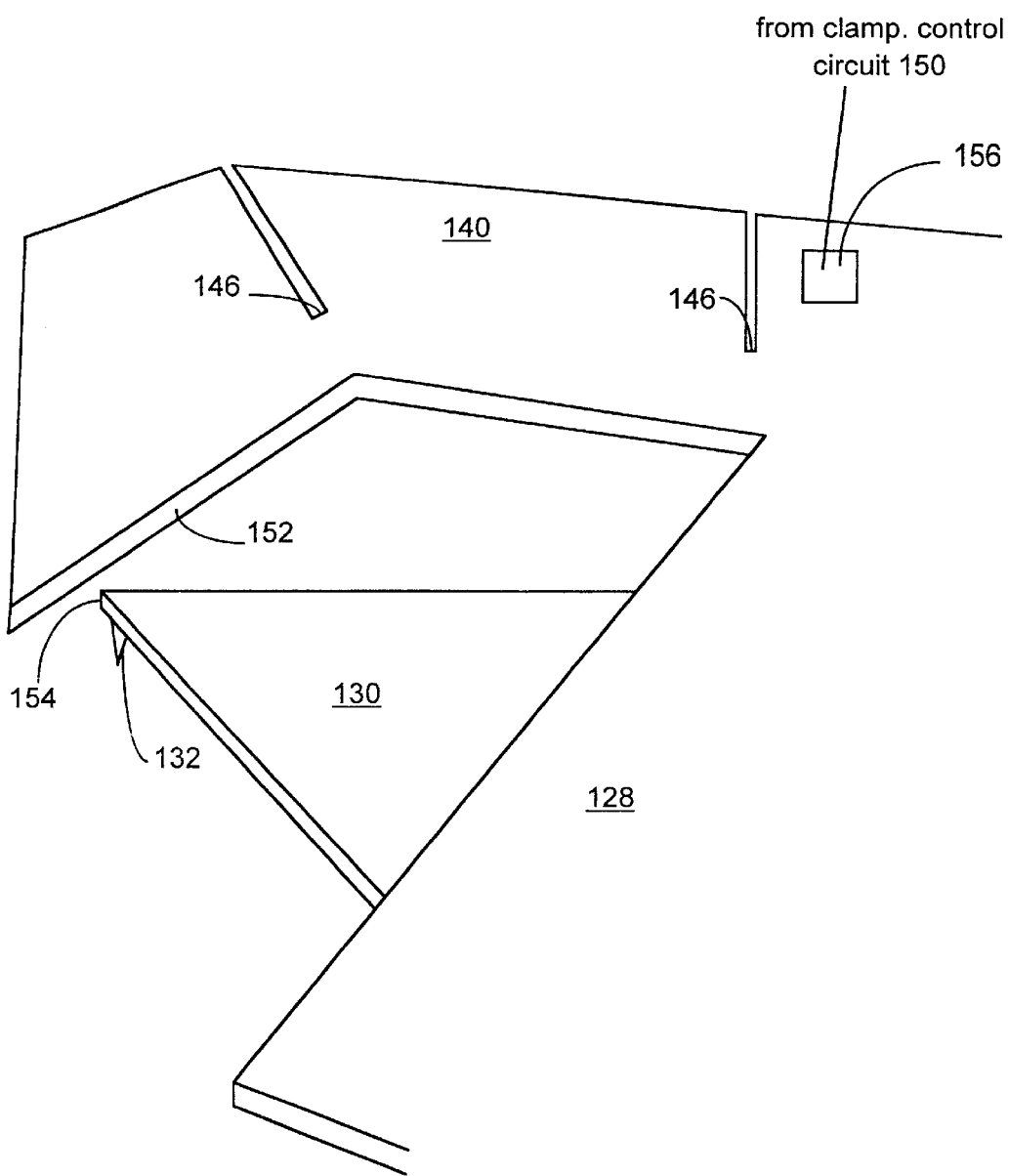
Figure 2C:
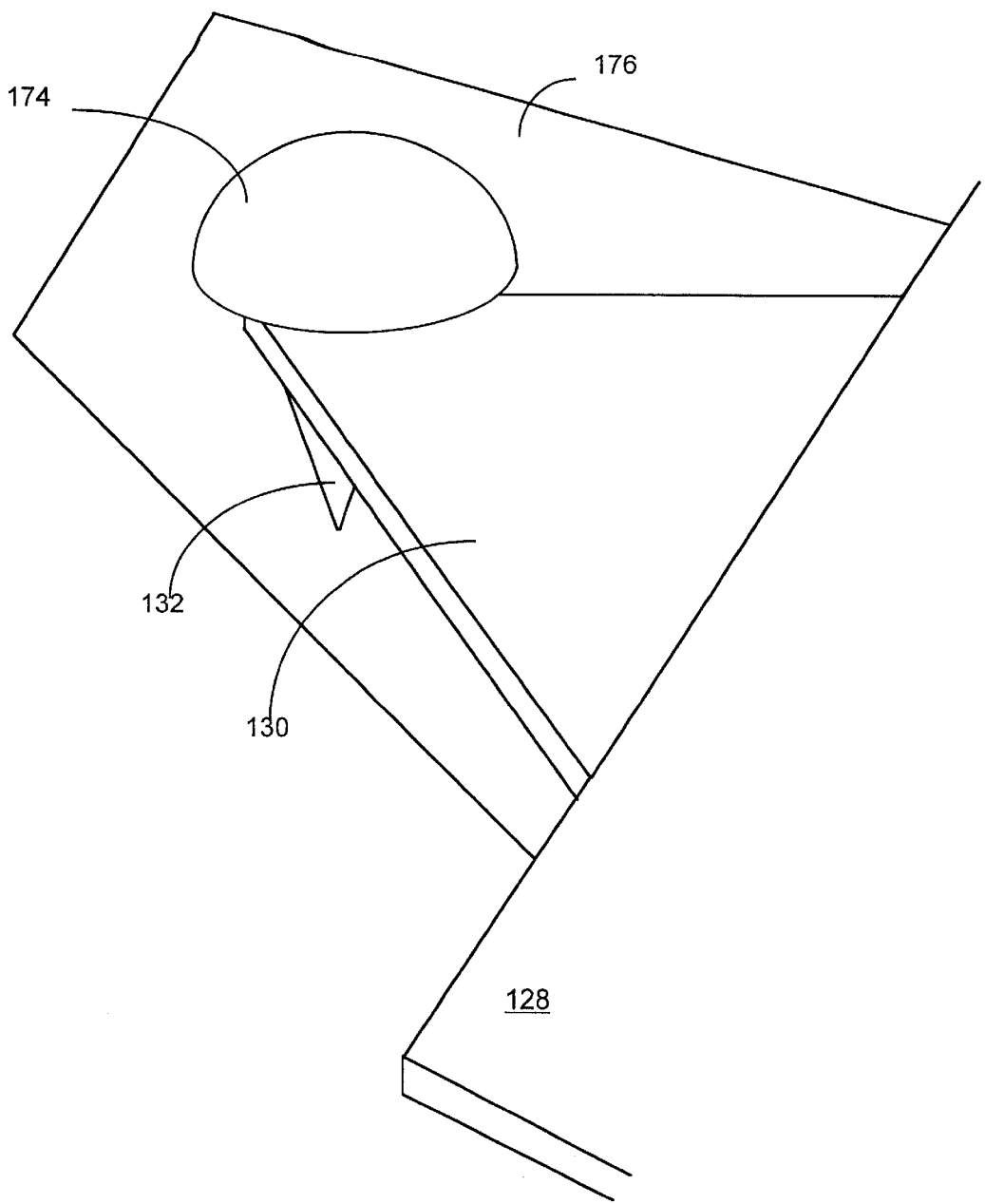
FIG. 2c shows the probe of the scanning probe microscope assembly of FIG. 2a or 2b with an attached refractive lens over the tip of the probe.

Alternatively, an electrode 156 may be fixed to the clamping arm 140, as shown in FIG. 2b. In response to the clamping arm movement signal provided by the clamping control circuit 150 of FIG. 1, the electrode 156 applies an electrostatic charge to the clamping arm 140. As in the embodiment of FIG. 2a, the clamping arm 140 expands at the action joints 146 so that the free end 152 of the clamping arm 140 moves in and presses against the free end 154 of the cantilever 132.

Figure 3A:
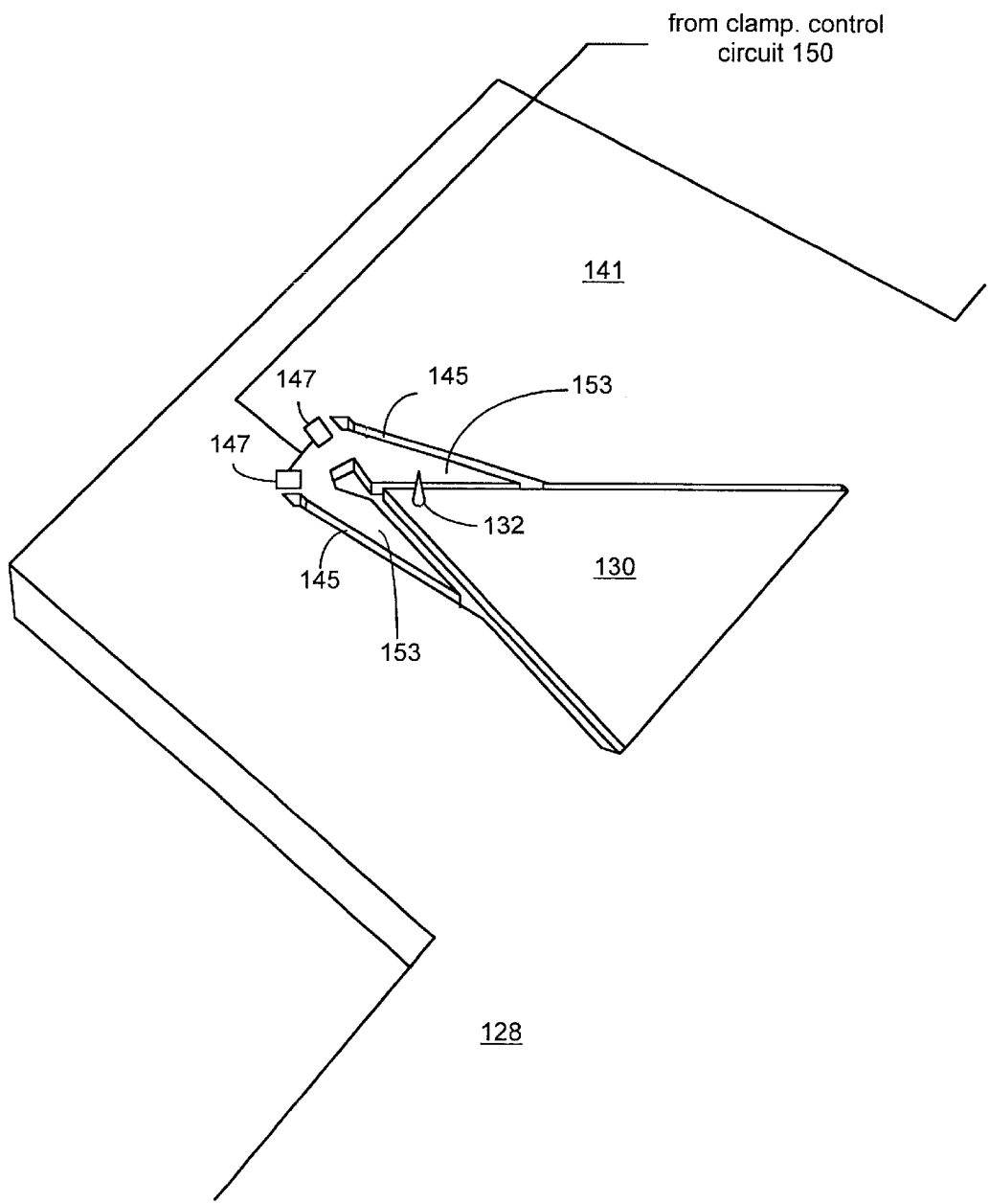
FIGS. 3a and 3b show still other embodiments of a clamping structure for holding rigid the cantilever of the scanning probe microscope assembly of FIG. 1 during the STM mode.

FIG. 3a shows an alternative clamp in the form of a clamping structure 141 that is integrally formed with the base 128 and surrounds the cantilever 130. The clamping structure 141 has slots 145 which form action joints 147 at the closed ends of the slots 145.

Similar to the embodiment of FIG. 2a, heating elements 149 are disposed on the clamping structure 141 at the action joints 147. When the user has selected the STM mode, the clamping control circuit 150 provides a clamping structure movement signal to the heating elements 149. The heating elements 149 heat the action joints 147 so that the clamping structure 141 expands at the action joints 147 and the clamping arms 153 of the clamping structure 141 move in and press firmly against the sides of the cantilever 130.

Figure 3B:
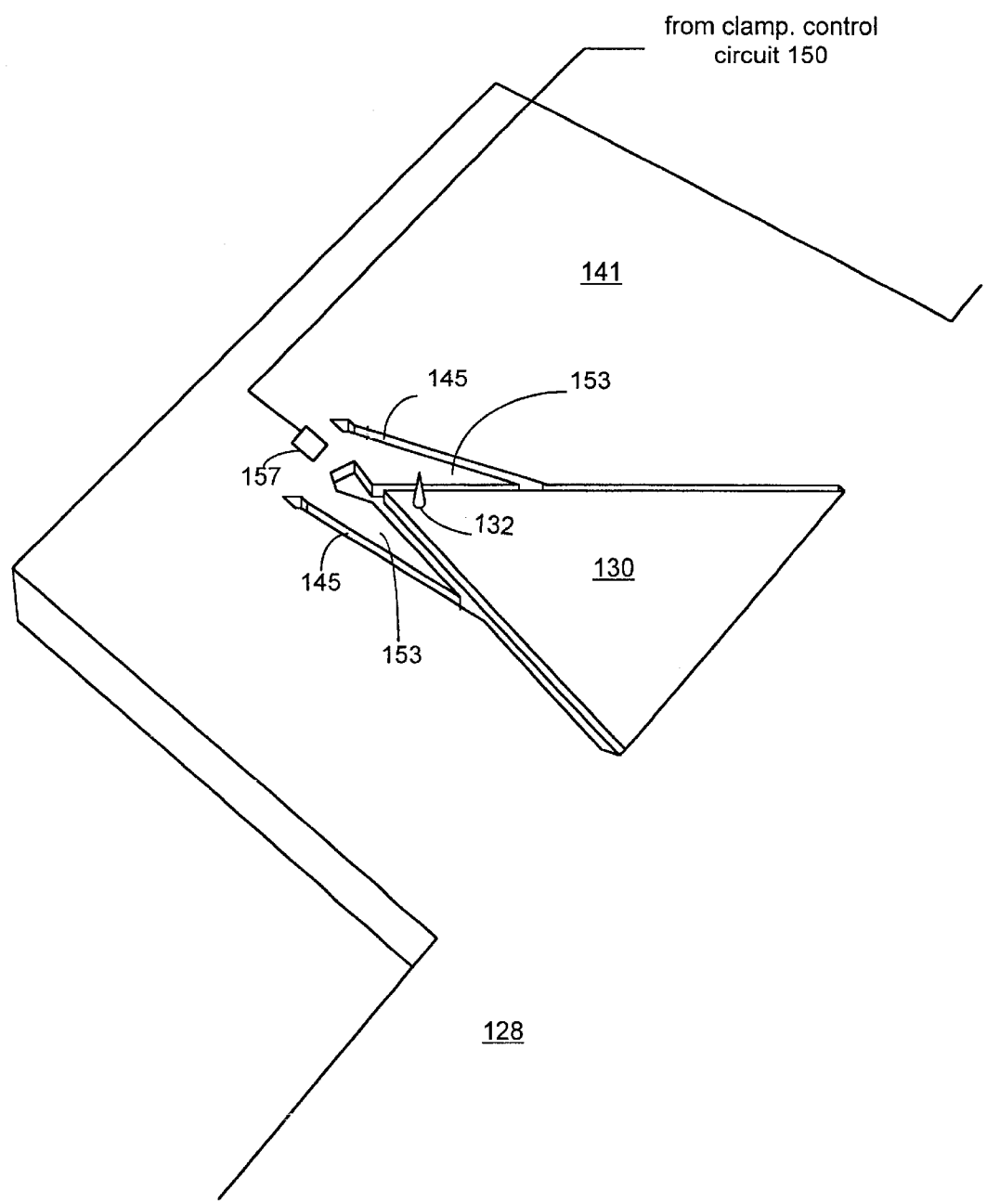
Figure 3C:
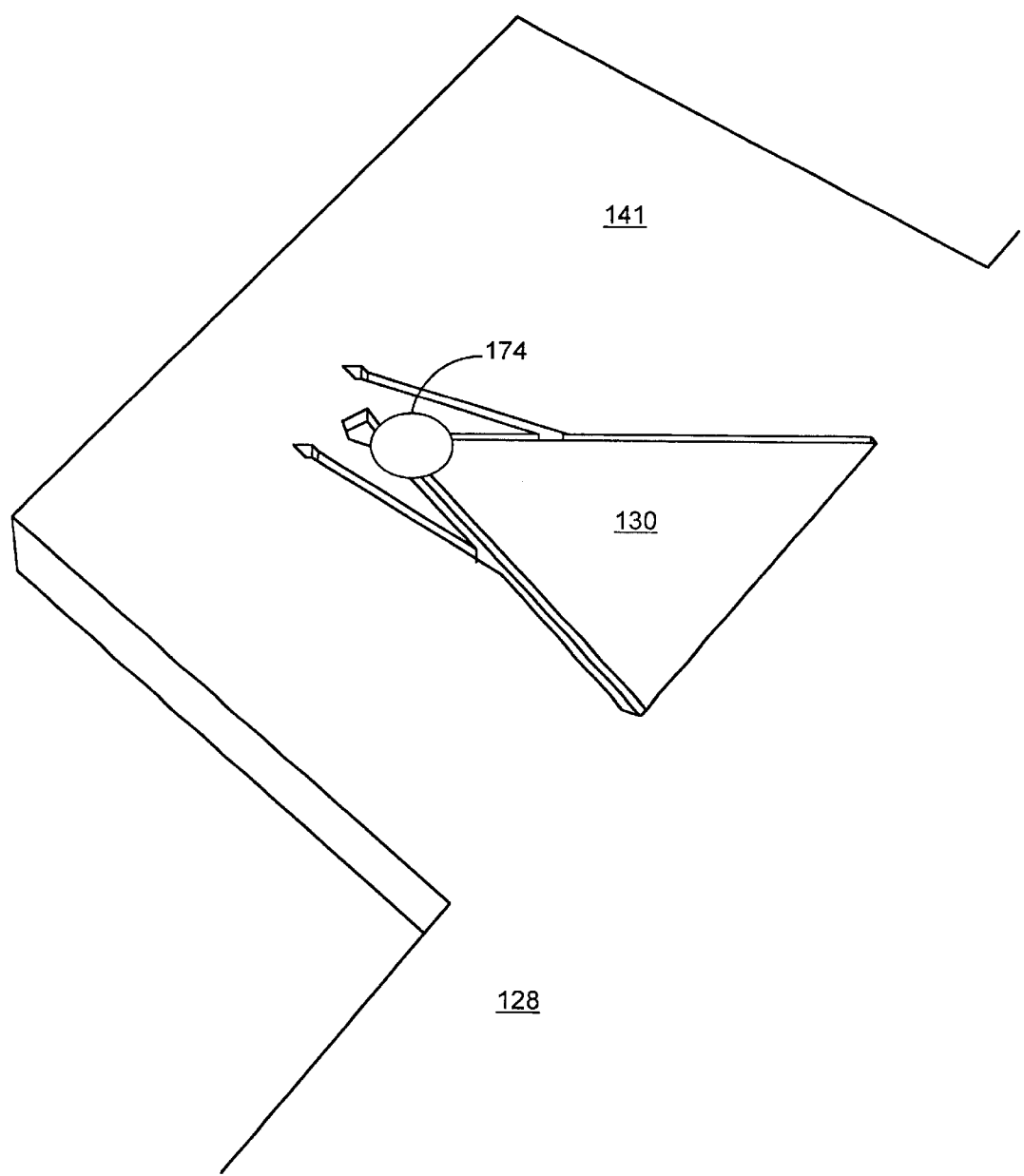
FIG. 3c shows the probe of the scanning probe microscope assembly of FIGS. 3a or 3b with an attached refractive lens over the tip of the probe.

Alternatively, an electrode 157 may be fixed to the clamping structure 141, as shown in FIG. 3b. Similar to the embodiment of FIG. 2b, the electrode 157 applies an electrostatic charge to the clamping structure 141 in response to the clamping structure movement signal provided by the clamping control circuit 150. Like in the embodiment of FIG. 4, the clamping structure 141 expands at the action joints 147 and the clamping arms 153 move in and press against the sides of the cantilever 130. As shown in FIG. 3c, the clamping structure 141 of FIGS. 3a and 3b serves as a shelf and support for the lens 174 which may be independent from or integrally formed with the clamping structure 141. The optical operation of the lens 174 will be described later.

Figure 4A:
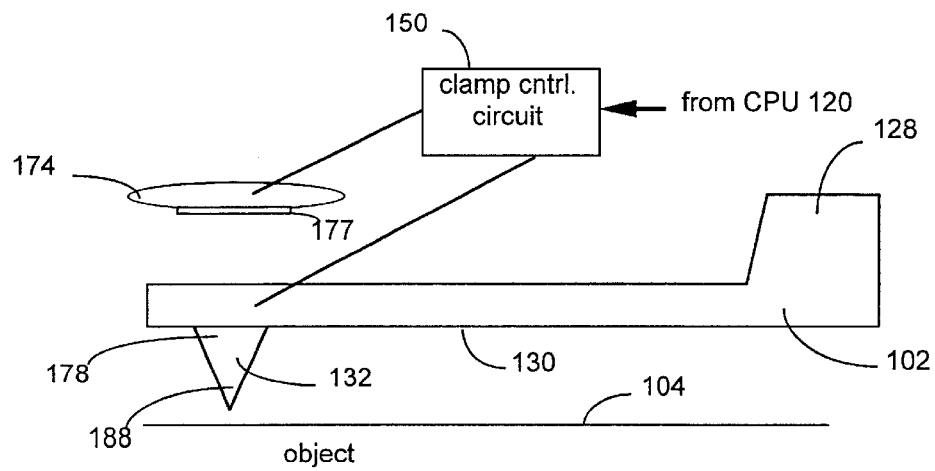
FIGS. 4a and 4b show further embodiments of a clamping device for holding rigid the cantilever of the scanning probe microscope assembly of FIG. 1 during the STM mode.
Figure 4B:
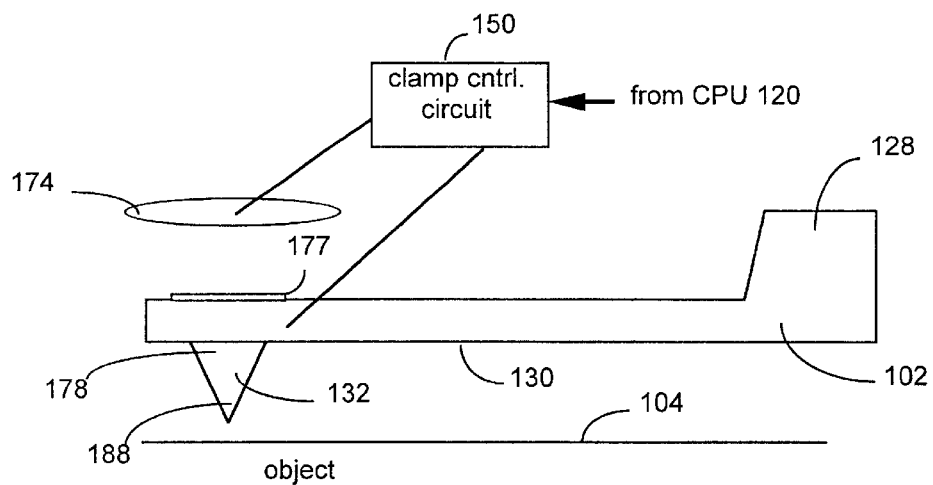

Referring to FIGS. 4a and 4b, the lens 174 can be used to provide clamping of the cantilever 130 alone or in conjunction with the embodiments of FIGS. 3a and 3b. As shown in FIGS. 4a and 4b, an optically transparent insulating layer 177, such as silicon dioxide, is formed on the lower surface of the lens 174 (or similar support member) or the upper surface of the cantilever 130. In the STM mode, the clamping control circuit 150 applies an appropriate voltage between the lens 174 and the cantilever 130 so as to form a capacitive structure which electrostatically clamps the motion of the cantilever 130. Those skilled in the art will appreciate that this configuration can additionally be used to damp, drive, or detect the motion of the cantilever 130 depending on which of the modes of operation described herein is being employed by scanning probe microscope 100.

Figure 5:
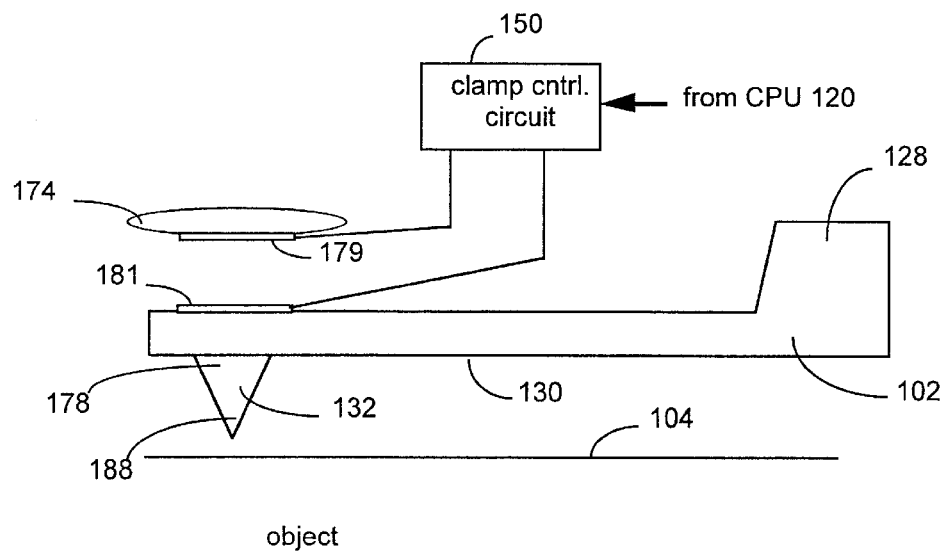
FIG. 5 shows yet another embodiment of a clamping device for holding rigid the cantilever of the scanning probe microscope assembly of FIG. 1 during the STM mode.

Alternatively, optically transparent and conductive coil patterns 179 and 181 are respectively formed on the lower surface of lens 174 and the upper surface of the cantilever 130, as shown in FIG. 5. The coil patterns 179 and 181 are formed from Indium Tin Oxide. In the STM mode, the clamping control circuit 150 applies voltages to the coil patterns 179 and 181 so that their currents are opposite in direction. As a result, an attractive magnetic field is created which immobilizes (i.e., clamps) the cantilever 130. Those skilled in the art will appreciate that one of the coil patterns 179 or 181 may be replaced with a permanent magnet formed with a thin film of samarium cobalt or other permanently magnetizable material. Moreover, this arrangement may also be used to damp, drive, or detect the motion of cantilever depending on which of the modes of operation described herein is being employed by scanning probe microscope 100.

Referring back to FIG. 1, in the STM mode, the scanning control signals generated by the scanning control routine 122 control the XY and Z translators 110 and 112 so that tip 132 is positioned in close proximity to the object 104. Then, scanning control routine 122 generates tunneling control signals provided to the tunneling current measurement circuit 158. In response, the tunneling current measurement circuit 158 generates a voltage signal applied to the tip 132 of probe 102.

Since tip 132 is coated with a conductive layer, a tunneling current is produced between the tip 132 and the object 104. The tunneling current in the object 104 is detected and measured by the tunneling current measurement circuit 158. In response, the tunneling current measurement circuit 158 outputs a tunneling current measurement signal containing data representing the measured tunneling current. The measured tunneling current corresponds to the topography of the object.

Alternatively, those skilled in the art will appreciate that the tunneling current may be kept fixed by changing the position of tip 132 with the Z axis translator 112. The amount of change in position required to keep the tunneling current constant is the measure of topography of the surface.

The tunneling current signal is provided to the CPU 120. The data contained by the signal is analyzed and processed by the STM analysis routine 138 to produce STM image data representing a high magnification (or nanoview) image of the topography of the object 104. The display routine 136 then formats the STM image data, in the way described later, and the CPU 120 provides it to the display monitor 118 for display. The routine 138 is stored in the memory 124 and run on the CPU 120.

Low Magnification Confocol Microscopy Mode

Referring again to FIG. 1, scanning probe microscope assembly 100 is configured also to provide confocal microscopy. As is explained later, the confocol microscopy mode may occur when the user issues with control terminal 116 a low magnification zoom control signal received by the CPU 120 for a low magnification scan of the object 104 in the manner to be described later. During this scan, the scanning control routine 122 generates scanning control signals outputted by the CPU 120 for controlling the XY translator 110 to position probe 102 over the surface of the object 104 for a low magnification confocol microscopy measurement. As will be described later, the low magnification confocol microscopy mode is used in conjunction with the high magnification AFM or STM modes and the medium magnification optical microscopy mode (discussed later) to provide for a continuous zoom display of an image of object 104 on the display monitor 118.

In order to perform low magnification confocol optical microscopy, scanning probe microscope assembly 100 includes a conventional confocol optical microscope 160. The microscope 160 may be a spot scanning confocol microscope such as that described in U.S. Pat. No. Re. 34,214, which is hereby explicitly incorporated by reference, or it may be a spinning disk confocol microscope such as that described in U.S. Pat. No. 4,927,254.

The visible light source of the microscope 160 illuminates the object 104 with visible light. The portion of visible light which is within the visible field of view of the microscope 160 and reflected by the object 104 and the probe 102 is then received by the microscope 160. This reflected visible light passes through the beam splitter 166 to the filter of the microscope 160 which removes any non-visible components. The filtered visible light is then focused on the camera 162 by the eyepiece (i.e., focusing lens) of microscope 160. The objective of microscope 160 is chosen to provide a numerical aperture in the range of approximately 0.1–0.2 for low magnification (i.e., macroview of) visible images of the object 104.

The visible optical camera 162 of the scanning probe microscope assembly 100 then converts the focused visible light into a data signal containing data representing the focused visible light. The data contained by the signal is analyzed and processed by the low magnification confocol optical microscopy analysis routine 139, in the manner described later, to produce visible image data representing a low magnification (or macroview) visible image of the topography of the object 104. The display routine 136 then formats the visible image data, in the way described later, and the CPU 120 provides it to the display monitor 118 for display. The routine 139 is stored in the memory 124 and run on the CPU 120.

Medium Magnification Optical Microscopy Mode

The scanning probe microscope assembly 100 of FIG. 1 is further configured to provide medium magnification infrared or visible optical microscopy. The medium magnification microscopy mode may occur when the user issues with control terminal 116 a medium magnification zoom control signal received by the CPU 120 for a medium magnification scan of the object 104, as is explained later. During this scan, the scanning control routine 122 generates scanning control signals outputted by the CPU 120 for controlling the XY translator 110 to position probe 102 over the surface of the object 104 for a medium magnification optical microscopy measurement. As was alluded to earlier, the medium magnification optical microscopy mode is used in conjunction with the high magnification AFM or STM mode and the low magnification optical microscopy mode to provide a continuous zoom display of an image of object 104 on the display monitor 118.

In the case where tip 132 is made of a material, such as silicon, which is opaque to visible light, the scanning control routine 122 generates control signals for controlling the light source 180 to provide a wide beam of infrared light. The light source 180 of the spectrophotometer 182 is configured so that the wavelength (i.e., frequency) and beam size of the light that it provides may be varied in ways well known to those skilled in the art. In the preferred embodiment, this light source 180 is variable in wavelength over the range of approximately 6 microns to 200 nm and has a beam size variation ratio of approximately 1000 to 1 so that the beam can be as made as narrow as the base of the tip 132 (down to 1 micron) and as wide as the largest objective in the system (up to 2 cm).

The wide beam of infrared light is directed by the beam splitters 186 and 188 to the beam splitter 166. The beam splitter 166 reflects (i.e., directs) the wide beam of infrared light to the lens system 174.

Figure 6:
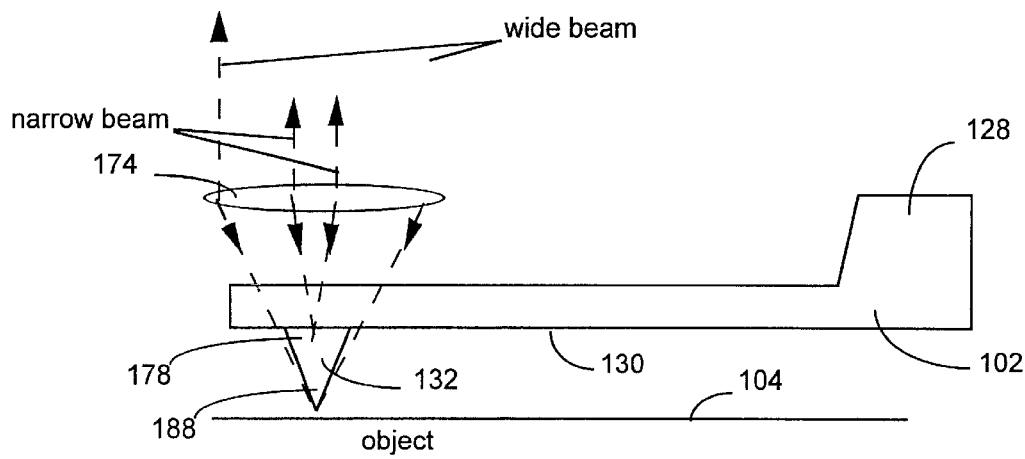
FIG. 6 shows the operation of the lens of FIG. 2c or 3c.

As shown in FIG. 6, the lens system 174 is disposed over the portion of the cantilever 130 connected to the base 128 of the tip 132. For the embodiments of FIGS. 2a and 2b, the lens system 174 is held and supported by the thin lens system support 176, as shown in FIG. 2c. The lens system support 176 is transparent to visible light, is connected to the base 128 of the probe 102, and holds and supports the lens system 174. For ease of illustration, FIG. 2c does not show the clamping arm 140 shown in FIGS. 2a and 2b.

The lens system 174 may be a standard objective arrangement of one or more lenses to form an appropriate tube length or provide the preferred infinity corrected tube length in a manner well known to lens designers. A two lens system may be made by providing a mounting barrel with a partial or complete hole in the thin support structure. Moreover, as those skilled in the art will appreciate, lens system 174 may be a fresnel lens arrangement constructed similar to the fresnel lens 250 shown in FIGS. 11a and 11b.

The lens system support 176 is transparent to visible light and may extend across the entire visible field of the visible optical microscope 160. It may include a cutoff filter such that only visible light may pass through it while infrared light is blocked except in a central area within the lens system 174 where it acts like a field stop (part of standard objective lens design practice and well known in the art) to eliminate extraneous light which would lower contrast in the medium magnification optical mode.

The lens system support 176 may also be an electrooptically adjustable iris, mechanical iris, optically enabled iris, such as a glass assembly made from glass doped everywhere except over lens system 174 which becomes opaque on exposure to UV light from the light source 180, and may be used as a field stop. This is true even when lens system 174 is a fresnel lens arrangement such as that shown in FIGS. 12a and 12b.

For the embodiments of FIGS. 3a, 3b, 4a, 4b, and 5, the lens system 174 and the clamping structure 141 are shown in FIG. 3c. The clamping structure 141 serves as a support shelf for lens system 174.

Referring again to FIG. 6, lens system 174 is spaced from the cantilever 130 such that it has a focal length in focus with the surface of the object (and also the sharp end 188 of the tip 132) for the wide beam of infrared light 167 received from the beam splitter 166. The focal length is chosen so that lens system 174 has a numerical aperture in the range of approximately 0.7 to 0.9 to provide medium magnification (i.e., microview of) images of the object 104. Typically, the lens system 174 is disposed above the cantilever 130 in the range of approximately 40 to 4000 microns.

Moreover, lens system 174 occupies only a small area of the visible light field of view of the microscope 160. In particular, lens system 174 has a diameter substantially smaller than the diameter of the objective lens of the microscope 160 shown in FIG. 1 but large enough to allow the wide beam of infrared light to be focused at the surface of the object 104, as shown in FIG. 6. The diameter of lens system 174 must be appropriate for the size of the cantilever 130 and is typically less then 2 mm and is approximately in the range of 100 to 500 microns.

Moreover, FIG. 1 shows the optical path of the cantilever deflection optics 134 traveling through the lens system support 176 but not the lens system 174. However, those skilled in the art will appreciate that the optics 134 may be arranged to have an optical path that travels through the lens system 174.

The wide beam of infrared light focused by the lens system 174 at the surface of the object 104 is reflected by the object 104 back to the lens system 174, as shown in FIG. 6. Referring to FIG. 1, the beam splitters 166 and 188 direct the reflected infrared light to the optics 168. The filter of the optics 168 allows only the wide beam of reflected infrared light to pass which is then focused by the eyepiece (i.e., focusing lens) of the optics 168 on the camera 178.

The camera 178 converts the focused infrared light into an infrared data signal containing data representing the focused infrared light. The data contained by the signal is analyzed and processed by the medium magnification optical microscopy analysis routine 141 to produce infrared image data representing a medium magnification (or microview) image of the topography of the object 104. The display routine 136 then formats the infrared image data, in the way described later, and the CPU 120 provides it to the display monitor 118 for display. The routine 141 is stored in the memory 124 and run on the CPU 120.

Alternatively, when the tip 132 is made of a material, such as silicon nitride, which is transparent to visible light, then lens system 174 may be configured and disposed over the tip 132 so that it has a focal length in focus with the surface of the object (and also the sharp end 188 of the tip 132) for a portion of the visible light provided by the visible light source of the microscope 160. Again, the focal length is chosen so that lens system 174 has a numerical aperture in the range of approximately 0.7 to 0.9 to provide medium magnification (i.e., microview of) images of the object 104.

The portion of visible light focused by the lens system 174 at the surface of the object 104 is reflected by the object 104 back to the lens system 174. From there, it is directed by the beam splitters 166 and 188 to the optics 168. In this case, the filter of the optics 168 allows only the visible light portion to pass through and be focused by the eyepiece of the optics 168 on the camera 178.

The camera 178 converts the focused visible light into a visible data signal containing data representing the focused visible light. Similar to above, the medium magnification optical microscopy analysis routine 141 produces medium magnification visible image data representing a medium magnification (or microview) image of the topography of the object 104 which is then formatted by the display routine 136 and displayed on the display monitor 118.

Near-Field Spectrophotometry Mode

Referring to FIG. 1, scanning probe microscope assembly 100 is configured also to perform near-field spectrophotometry. As explained later, the near-field spectrophotometry mode may occur when the user selects this mode with the control terminal 116 and issues with control terminal 116 the high magnification zoom control signal described earlier. The near-field spectrophotometric measurements may be made in conjunction with AFM and STM measurements during the high magnification scan.

When a near-field spectrophotometric measurement is to be made, scanning control routine 122 will generate scanning control signals outputted by the CPU 120 for controlling the XY and Z translators 110 and 112 to position tip 132 in close proximity to the object 104 for making near-field spectrophotometric measurements. In the preferred embodiment, the sharp end 188 of the tip 132 is placed from the object 104 no further then approximately half of the wavelength of the light provided by the light source 180 for the near-field spectrophotometric mode.

Additionally, scanning control routine 122 generates control signals to control light source 180 to provide a narrow beam of infrared or visible light which is transparent to the probe 102 and the lens system 174. This is done at a variety of chopping frequencies to enable the photodetectors 192 and 194 of the spectrophotometer to discriminate between the detected optical energy due to excitation by the light and detected background energy through lock-in amplification and other noise rejection and amplification methods well known to those in the art. As a result, spectrophotometer 182 may make absorption, Raman, second harmonic, fluorescence, and other well known spectrophotometric measurements of the object 104.

The mechanically rotatable plane polarizer 184 is held stationary in the near-field spectrophotometry mode. The light from the light source 180 is plane polarized by the polarizer 184, passes through the beam splitters 186 and 188, and is directed by the mirror 172 to the lens system 174.

The light is focused by the lens system 174 within the base 178 of the tip 132, as shown in FIG. 6. The tip 132 acts similar to an antenna coupled to a waveguide such that the light focused within the base 178 propagates through the tip 132 and is emitted at the sharp end 188 of the tip 132. The emitted light optically interacts with the object 104. Since the tip 132 acts as an antenna, the sharp end 188 of the tip 132 captures the resulting light due to the optical interaction of the emitted light with the object 104. This light propagates back through the tip 132 to the lens system 174.

As was just alluded to, tip 132 acts similar to an antenna. This, the propagation in, emission of, and capture of energy in a pyramid shaped antenna is analogous to that of tip 132 when shaped as a cone or tetrahedral. The propagation, emission, and capture of energy in a pyramid shaped antenna is described in *The Radiation Patterns of Dielectric Rods-Experiment and Theory*, by R. B. Watson and C. W. Horton, Journal of Applied Physics, volume 19, pg. 661 (1948) and is expressly incorporated by reference herein.

Specifically, the electrical and magnetic fields at the base 178 of tip 132 are analogous to the following equations which define the electrical and magnetic fields at the base of a pyramid shaped antenna:

$$E_{o1} = x \cos(\pi y_1/b) \exp(-j(\omega t - k' z_1)),$$

$$H_{o1} = [y(k'/\omega \mu) \cos(\pi y_1/b) + z(\pi/j \omega \mu b) \sin(\pi y_1/b)] \exp(-j(\omega t - k'$$

where a and b represent the size of the sides of the base of the pyramid shaped antenna, k represents the wave number in a vacuum, and k' represents the wave number in the material of a waveguide connected to the antenna.

The method employed by Watson and Horton prescribes magnetic currents on the two electrical field plane sides of the pyramid shaped antenna and electric currents on the two magnetic field plane sides. The emitted and captured optical energy is then found by applying a Fresnel-Huygens method to obtain the radiation fields produced by these currents. Adopting spherical geometry, with the z axis corresponding to $\theta=0$, the following fields are obtained:

$$E_r=0,$$

$$E_\theta=(jk\cos\theta)P_1(\theta,\phi),$$

$$E_\phi=(-jk\sin\phi\cos\theta)P_1(\theta,\phi).$$

where $$P_1(\theta,\phi)=M_0\cos[(ka/2)\sin\theta\cos\phi] \cdot I_1 \cdot I_2$$

$$I_1 = 2\frac{b}{\pi}\frac{(\pi/2)^2\cos((kb/2)\sin\theta\sin\phi)}{(\pi/2)^2 - ((kb/2)\sin\theta\sin\phi)^2}$$

$$I_2 = \frac{1}{2k}(A - jB),$$

$$A = \frac{1}{n-\cos\theta}[1-\cos[(n+\cos\theta)kl]] + \frac{1}{n+\cos\theta}[1-\cos[(n+\cos\theta)kl]]$$

$$B = \frac{\sin[(n-\cos\theta)kl]}{n-\cos\theta} - \frac{\sin[(n+\cos\theta)kl]}{n+\cos\theta}$$

Here n=k/k' and l is the length of the pyramid shaped antenna in the z direction.

It is clear from the foregoing discussion, that the propagation, emission, and capture of energy described by these equations is analogous to that which occurs in tip 132. FIGS. 7a and 7b provide electrical field plane and magnetic field plane polar plots of optical energy emissions by tip 132 in accordance with the above equations.

Referring again to FIG. 1, from the lens system 174, the captured light is directed by the mirror 166 through the beam splitters 188 and 186 to the monochromator 190. In the preferred embodiment, the monochromator 190 is conventionally configured to separate the captured light into an array of its constituent wavelengths. The photodetector 192 includes an array of photodiodes or photomultipliers for detecting emissions at the various wavelengths. Alternatively, the monochromator 190 may be conventionally configured to sequentially separate the wavelengths of the captured light and the photodetector 192 may be conventionally configured to sequentially scan the spectrum of wavelengths.

The photodetector 192 converts the detected optical energy (i.e., detected wavelengths) into a detection signal containing data representing the detected optical energy. The data contained by the signal is analyzed and processed by the near-field spectrophotometry analysis routine 143 to produce data representing information on the composition of the object 104. Depending on the particular wavelength of the light provided by the light source 180, the optical interaction between the tip 132 and the object may involve reflection, absorption, photoemission (including fluorescence, Raman, and second harmonic), and/or other types of well known interactions.

As was indicated earlier, the scanning control routine 122 generates control signals for varying the wavelength of the light provided by the light source 180. As a result, the above described interactions may be detected by the photodetector 192 and analyzed by the analysis routine 143 to produce data representing information on the composition of the object 104. The data is then formatted for display, in the way described later, by the display routine 136 and provided to the display monitor 119 for display of this information.

Alternatively, or in conjunction with the near-field spectrophotometric arrangement described above, scanning probe microscope assembly 100 of FIG. 1 may also perform near-field spectrophotometry by detecting light energy from the near-field with the photodetector 194 at a distance which is many wavelengths away from the tip 132. In this arrangement, optical interaction between tip 132 and the object 104 is induced in the same way as was described earlier. However, the resulting photoemissive energy (such as fluorescence, Raman, and second harmonic) is detected by the photodetector 194 after the monochromator 196 has separated the photoemissive light into its constituent wavelengths. As with the monochromator 190, the monochromator 196 is preferably configured to separate the photoemissive light into an array of its constituent wavelengths and the photodetector 194 includes an array of photodiodes or photomultipliers for detecting the array of wavelengths.

Photodetector 194 converts the detected optical energy into a detection signal containing data representing the detected optical energy. The data contained by the detection signal is provided to the CPU 120 and analyzed and processed by the near-field spectrophotometry analysis routine 147 to produce data representing information on the composition of the object 104. This data is formatted by the display routine 136, in the way described later, and provided to the display monitor 119 for display of the information.

Near-Field Optical Microscopy Mode

Turning again to FIG. 1, scanning probe microscope assembly 100 is also configured to perform near-field optical microscopy to define deep surface features of the object 104 which cannot be detected through the AFM or STM mode. Like the near-field spectrophotometry mode, the near-field optical microscopy mode may occur when the user selects this mode with the control terminal 116 and issues with control terminal 116 the high magnification zoom control signal described earlier. The near-field optical microscopy measurements may be made in conjunction with AFM, STM, and spectrophotometric measurements during the high magnification scan.

As was just alluded to, this mode is used when the AFM or STM measurements indicate that tip 132 is not directly over a structure of the object 104 and is instead directly over a deep surface feature, such as a pit, wall, or projection. When this occurs, optical interaction between tip 132 and the object 104 is induced in the same way as was described earlier for the near-field spectrophotometry mode except that scanning control routine 122 issues a control signal for controlling the rotatable plane polarizer 184 to rotate during this mode. As a result, the light is rotationally plane polarized (i.e., the polarization state of the light provided by the light source 180 is continuously changed) during the near-field optical mode.

The optical energy pattern detected by the photodetector 192 or 194 during this rotation is recorded by the near-field optical analysis routine 151. The routine 151 then compares the recorded optical energy pattern with predefined optical energy patterns stored in the data base 198 of the memory 124 which correspond to various types of deep surface features. This comparison is made in order to determine what is directly underneath or near tip 132. The analysis routine 151 then generates image data representing an image of the determined deep surface feature and the display routine 136 formats the data for display of this image on the display monitor 118.

Moreover, this type of near-field microscopy may be used to examine tip 132 in a tip testing mode. This is done by placing tip 132 over a uniform and already defined hole in an object. By comparing the optical energy pattern detected by the photodetector 192 or 194 with a predefined optical energy pattern stored in the data base 198 for a non-defective tip, the analysis routine 151 can determine whether tip 132 is defective or not.

Alternatively, rather than utilizing the rotatable linear polarizer 184, those skilled in the art will recognize that scanning probe microscope assembly 100 may be configured so that the plane polarizer 184 is stationary and probe 102 is rotated by rotating the Z translator 112 in a conventional manner during this mode. Alternatively, object 104 may be rotated by rotating the XY translator 110 in a conventional manner during this mode. As a result, an optical energy pattern detected by the photodetector 192 or 194 during such rotation can be compared with predefined optical energy patterns stored in the data base 198.

Hardness Testing Mode

The scanning probe microscope assembly 100 of FIG. 1 is also configured to perform hardness testing of object 104. The hardness testing mode may also occur when the user selects this mode with the control terminal 116 and issues with control terminal 116 the high magnification zoom control signal. The hardness testing measurements may also be made in conjunction with AFM, STM, spectrophotometric, and near-field optical measurements during the high magnification scan.

In the hardness testing mode, the scanning control routine 122 controls the making of a near-field spectrophotometric measurement in the way described earlier at a particular location of the object 104. A detection signal is provided to the CPU 120 by the photodetector 192 or 194 and the hardness testing analysis routine 195 records in the data base 198 the data of the detection signal representing the optical energy detected by the photodetector 192 or 194. The routine 195 is stored in the memory 124 and run on the CPU 120.

Then, the scanning control routine 122 generates scanning control signals for controlling the Z translator 112 so that tip 132 directly contacts, penetrates, and deforms the surface of the object 104 with a known force at the same location where the near-field spectrophotometric measurement was just made. While the tip 132 penetrates the surface of the object, scanning control routine 122 then controls the making of another near-field spectrophotometric measurement at the same location.

The data contained in the resulting detection signal provided by the photodetector 192 or 194, together with the earlier recorded data, is analyzed and processed by the hardness testing analysis routine 195 to produce data representing. information on the hardness of the object 104. This is done by determining the proportionate change in the detected optical energy between the two measurements which provides a measure of the depth of penetration of tip 132. The depth of penetration in turn is a measure of the local binding strength (i.e., hardness) of the object 104. In bulk materials, this measure reflects local changes such as crystal dislocations, etc . . . In patterned materials, such as semiconductors, this measure provides subsurface structural information. This data is formatted by the display routine 136, in the way described later, and provided to the display monitor 119 for display of the hardness information.

Alternatively, the hardness testing mode may involve STM measurements. In this variation, the scanning control routine 122 controls the tunneling current measurement circuit 158 to make a conductivity measurement for object 104 at a particular location of the object 104 in a similar way to that described earlier for STM measurements. The data in the conductivity measurement signal representing the conductivity measured by the circuit 158 is recorded in the data base 198 by the hardness testing analysis routine 195.

Similar to before, the scanning control routine 122 generates scanning control signals for controlling the Z translator 112 to make the tip 132 directly contact, penetrate, and deform the surface of the object 104 with a known force at the same location. While the tip 132 penetrates the surface of the object 104, scanning control routine 122 then controls the making of conductivity measurements of object 104 at the same location.

The data in the conductivity signal over the period before and during the penetration is recorded, analyzed, and processed by the hardness testing analysis routine 195 to produce data representing information on the hardness of the object 104. In this case, the measured change in conductivity over the period before and during penetration is a measure of the depth of penetration of tip 132 and in turn a measure of the hardness of the object 104. The data produced by the routine 195 is formatted by the display routine 136 and provided to the display monitor 119 for display of the hardness information.

Additionally, the actual deflection or motion of the tip as measured by the optics 134 and the deflection measurement circuit 136 can be used by the hardness testing routine 195 in conjunction with the known force to provide a measure of the hardness of the surface. Like in the earlier described hardness testing embodiments, the data produced by the routine 195 is formatted by the display routine 136 and provided to the display monitor 119 for display of the hardness information.

Probe and Lens Composition In order to provide all of the foregoing modalities associated with the embodiment of FIG. 1, the probe 102 in the embodiment of FIGS. 2a–2c and the embodiment of FIGS. 3a–3c is formed from a wafer of silicon, silicon nitride, or some other material which is transparent to visible or infrared light. Specifically, in the case where infrared light is used for the medium magnification optical microscopy, the near-field optical microscopy, and the spectrophotometry modes, the probe is formed from a material, such as silicon, which is transparent to infrared light. And, in the case where visible light is used for these modes, the probe is formed from a material, such as silicon nitride, which is transparent to visible light.

The base 128, cantilever 130, tip 132, and clamping arm 140 or clamping structure 141 of probe 102 are etched from the wafer using conventional techniques known to those skilled in the art.

The lens system 174 may also be formed from silicon, silicon nitride, or some other material transparent to infrared or visible light depending on whether infrared or visible light is used for the modes just described above. Similarly, depending on whether infrared or visible light is used for these modes, the lens system support 176 of the embodiment of FIGS. 2a–2c is made of silicon, glass, or some other material transparent to infrared or visible light.

Figure 8A:
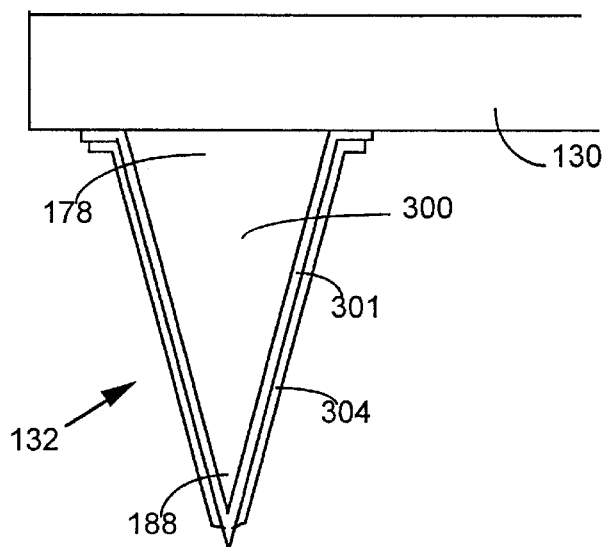
FIGS. 8a–8c show various embodiments of the tip of the scanning probe microscope assembly of FIG. 1.

As shown in FIG. 8a, the core material (silicon, silicon nitride, or other material) 300 of the tip 132 may be coated with an obdurate rigid material 301, such as diamond, tungsten, silicon carbide, or carbon nitride, to increase tip life, as shown in FIG. 8a. The obdurate coating 301 may have a thickness in the range of approximately 5 Angstroms to 1 micron.

To allow operation in the STM mode and/or contain light energy within the tip 132, the tip 132 may be coated using conventional techniques with a thin layer 304 of a conductive material, such as aluminum, tungsten, or gold. This layer 308 is formed over the core material 300 and any obdurate coating 301 at a thickness in the range of approximately 1 Angstrom to 1 micron.

A small portion of the conductive layer 304 is removed or rubbed off at the sharp end 188 of the tip 132 using conventional techniques to at least the point where the conductive layer 304 is no longer opaque to light propagating through the tip 132. Furthermore, the conductive coating 304 is removed or rubbed off only so that the conductive coating 304 ends approximately 5 to 10 nm from the point of the sharp end 188. As a result, an aperture having a diameter in the range of approximately 5 to 100 nm is formed at the sharp end 188.

Figure 8B:
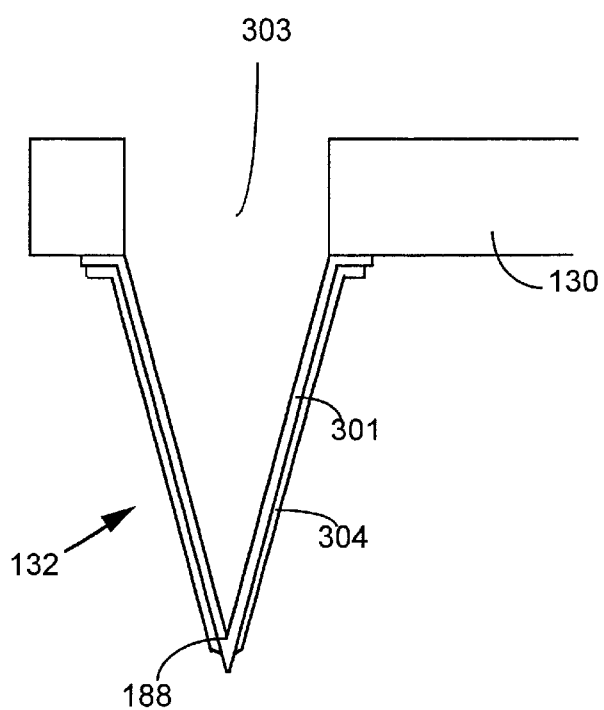
Figure 8C:
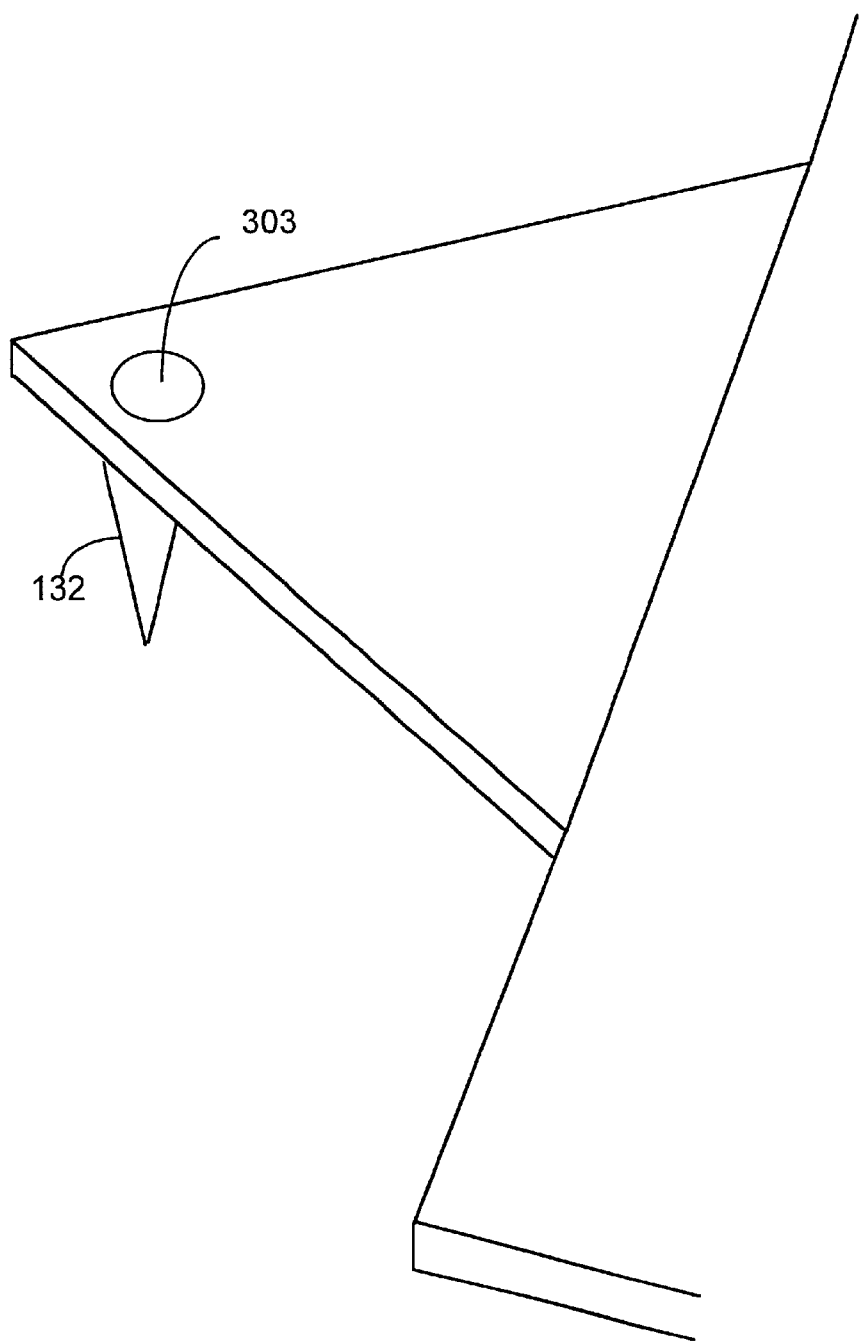

Alternatively, referring to FIGS. 8b and 8c, the core material 300 of the tip 132 and the core material 300 of the cantilever 130 over the tip 132 (shown in FIG. 8a) are etched away using conventional techniques to leave a hole 303 in the cantilever 130 and only the obdurate coating 301 and the conductive coating 304 as the tip 132. As in the tip 132 of FIG. 8a, the conductive coating 304 is removed or rubbed off from the sharp end 188 of the tip 132 to form an aperture near the sharp end 188. In operation, this tip 132 is substantially transparent (in the case of diamond) to an extremely broad range of wavelengths (0.1 to 20 microns).

Furthermore, if the obdurate coating 301 of FIGS. 8a–8c is a silicon carbide or silicon nitride coating, it may be doped using conventional techniques so as to be conductive. In this case, the conductive layer 304 would be omitted.

In the case where the obdurate coating 301 of FIGS. 8a–8c is a layer of diamond, the diamond crystals are grown so as to be oriented normal to the surface of the tip 132. This is done in the following manner.

First the wafer containing the probe 102 is placed in a vacuum arc deposition chamber containing carbon. A mask is placed over the probe 102 so that only the tip 132 and the area of the cantilever 130 around the base 178 of the tip 132 are exposed. At a pressure of approximately $1 \times 10^{-7}$ to $1 \times 10^{-11}$, the carbon is heated to a temperature of approximately 2100 to 3000° C. The carbon condenses on the surface of the core material 300 or an overlying tungsten, silicon carbide or silicon nitride layer.

The probe 102 is then placed in a methane hydrogen atmosphere for chemical vapor deposition (CVD) growth of the diamond layer 301 on the surface of the core material 300. The condensed carbon acts as a seed such that the diamond layer 301 grown is a layer of polycrystalline diamond oriented normal to the surface of the core material 300 or overlying layer.

In the case where the obdurate layer 301 is carbon nitride, the same seeding process as was described above is used. Then the probe 102 is placed in an atmosphere of monatomic nitrogen. The monatomic nitrogen is obtained by passing nitrogen gas through a hollow tungsten heater consisting of a hollow tungsten structure through which an electric current is passed. The tungsten heater is maintained at a temperature of 2100 to 3000° C. In one embodiment the tungsten heater also includes a quantity of carbon sufficient to combine chemically to form the carbon nitride layer 301 on the carbon condensation at the cool core material 300 surface (800° C.). The process begins without introducing nitrogen gas. After a few atoms of carbon are deposited, the nitrogen gas is introduced into the tungsten electrode and deposition and growth of the polycrystalline carbon nitride layer 301 is initiated.

Figures 8D, 12:
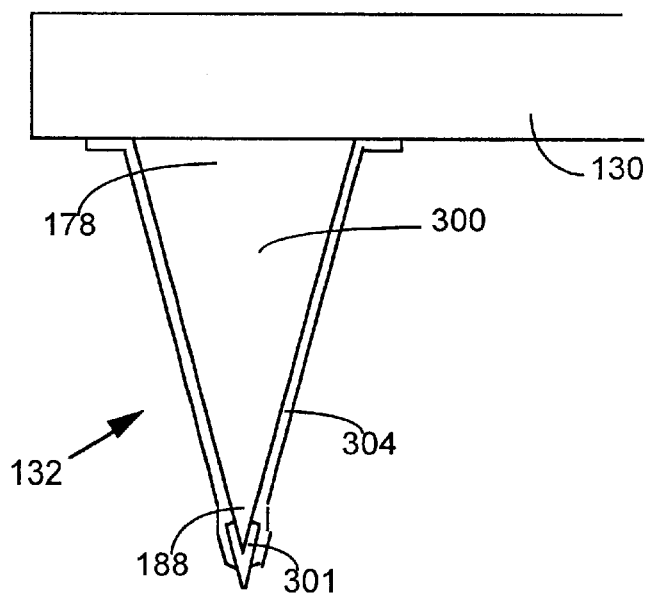
FIG. 12 shows the display routines of the microscope assembly of FIG. 1.

FIG. 8d shows a tip 132 with an obdurate diamond layer 301 over the core material 300 just at the sharp end 188. As in the tips 132 of FIG. 8a–8c, the conductive coating 304 is removed or rubbed off from the sharp end 188 of the tip 132 to form an aperture at the sharp end 188.

The core material 300 or an overlying tungsten, silicon carbide or silicon nitride layer at the sharp end 188 is pushed into or rubbed on a surface containing fine grain diamond (such as a lap or polycrystalline diamond coated surface). The sharp end 188 picks up a seed crystals of diamond. The probe 102 is then placed in a CVD environment for growth of the polycrystalline diamond layer 301 at the seed sites around the sharp end 188.

Scanning Sequence

Figure 9:
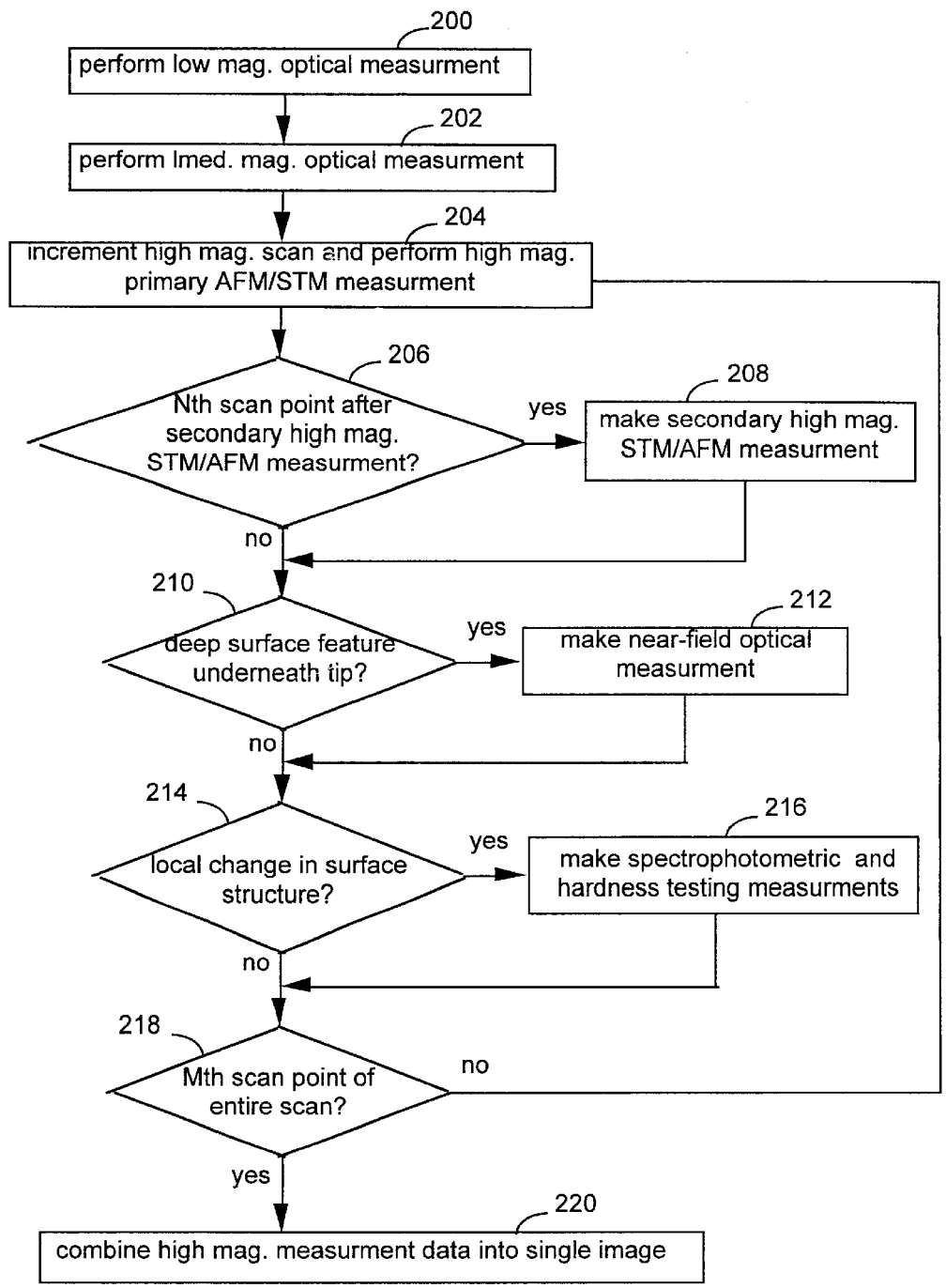
FIG. 9 shows a typical scanning sequence flow of operation of the scanning probe microscope assembly of FIG. 1.

FIG. 9 shows the scanning sequence controlled by the scanning control routine 122.

Initially, the user issues with the control terminal 116 a low magnification zoom control signal for directing a low magnification confocol microscopy scan of the object 104. In response, the scanning control routine 122 controls the XY translator 110 to position the object in the area specified by the low magnification zoom control signal and then low magnification confocol microscopy measurements are made in these areas in the way described earlier (block 200). This is done in order that the user may find an area of the object 104 to zoom in on for closer inspection with some of the other modes described earlier.

Figure 10:
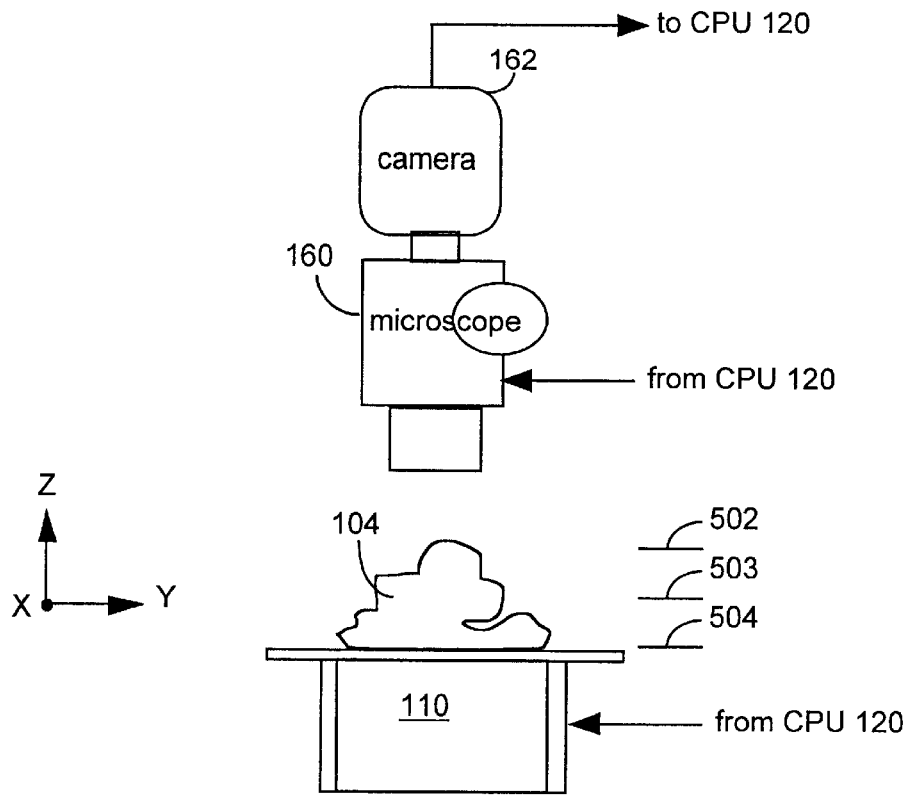
FIG. 10 shows a side view of a confocol microscope performing a scan in accordance with the present invention.

Referring to FIG. 10, in performing the low magnification confocol microscopy scan, the scanning control routine 122 first determines the upper and lower bounds 502 and 504 of the object 104 in the z direction. The upper and lower bounds 502 and 504 may be defined by the user (with the control terminal 116 shown in FIG. 1), fixed by the designer, or determined by the scanning control routine 122. These mehtods may be combined such that, for example, the upper/lower bound is defined and the lower/upper bound is determined.

In the case where the upper and lower bounds 502 and 504 are determined by the scanning control routine 122, the scanning control routine 122 controls the making of sample confocol microscopy measurements of the object 104 at low and high levels in the z direction. To do so, the scanning control routine 122 generates control signals to control the translator 110 for positioning the object in the x,y plane and generates control signals to control the optics of the microscope 160 for adjusting the confocol region (focol plane) in the z direction. However, those skilled in the art will appreciate that a translator that positions an object in each of the x,y, and z directions could also be used. The scanning control routine 122 then determines from the sample measurements the upper and lower bounds 502 and 504 (z2 and z1) of the object 104 and also the average diameter (n) of the smallest feature detected with the sample measurements.

Based on the upper and lower bounds z2 and z1 and the average diameter n of the smallest feature, the scanning control routine 122 determines in a binary tree the confocol regions in the z direction at which confocol microscopy measuremnemts will be made. Specifically, the scanning control routine 122 determines that the confocol regions for the object 104 will be at z1, z2, (z2−z1)/2, (z2−z1)/2+(z2−z1)/4, (z2−z1)/2−(z2−z1)/4, . . . (z2−z1)/2+(z2−z1)/4+ . . . (z2−z1)/2n, (z2−z1)/2−(z2−z1)/4− . . . (z2−z1)/2n. Thus the resolution of the scanning technique and number of confocol regions that will be scanned is the closest whole number to (z2−z1)/2n. These z values are then recorded in a table in the data base 198 shown in FIG. 1.

Figure 11:
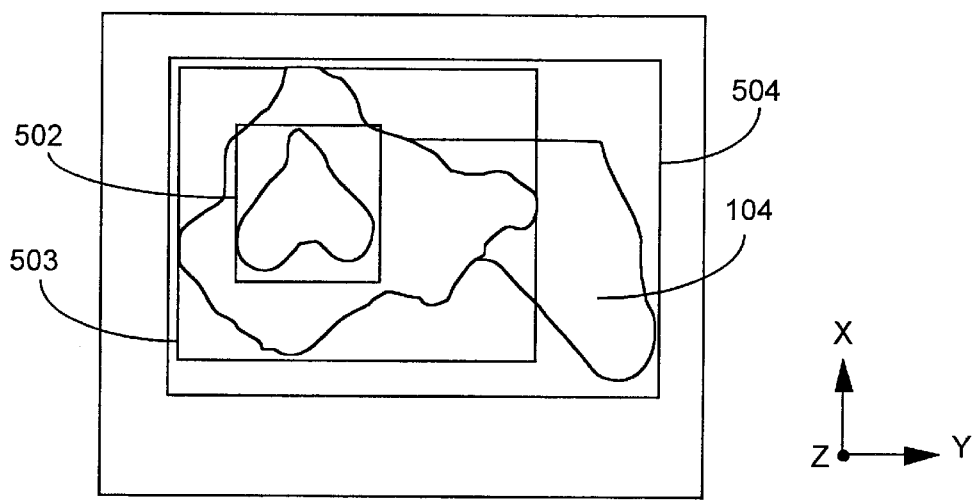
FIG. 11 shows a top view of the scan performed by the micrscope of FIG. 10.

Referring to FIG. 11, the scanning control routine 122 then determines at a number of confocol regions 502, 503, and 504 (in the z direction) the bounds of the object 104 in the x,y plane. This is also accomplished with sample measurements made under the control of the scanning control routine in the manner just described. The number of determined confocol regions in the table for which this is done is equal to or less than the resolution of the scanning technique just described. For each confocol region in the table for which x,y boundary values were determined, the scanning control routine 122 assigns the corresponding x,y boundary values to it in the table. If the number of confocol regions for which the bounds in the x,y plane are determined is less than the resolution of the scanning technique, then the scanning control routine 122 uses interpolation to assign x,y boundary values in the table to those confocol regions for which a bound in the x,y plane was not specifically determined.

In the case where the microscope 160 is a spot scanning confocol microscope, then the scanning control routine 122 uses the table to generate control signals to control the translator 110 and the optics of the microscope 16 for making confocol microscopy measurements at each confocol region in the table but only within the bounded area in the x,y plane whi6h the table specifies for it. Moreover, if the microscope 160 is a scanning disk confocol microscope, the scanning control routine 122 will generate control signals for controlling the optics of the microscope 160 to make confocol microscopy measurements at each confocol region in the table and controlling the camera 162 to only take measurement data for the bounded area in the x,y plane which the table specifies for it.

Thus, the table is used to limit the confocol micrscopy scan to those areas where most of the object 104 lies. This reduces substantially the time, hardware, and storage requirements needed to acquire a three dimensional confocol image.

Those skilled in the art will recognize that the described scanning technique may be modified to collect information in bounded sections aligned in z,x or z,y planes or in bounded spherical or other non-cartesian sections. In particular when working with simple high numerical aperture optics (in reflection or refraction) images are formed with substantial spherical (or some cases cylindrical) aberation, by using a matching spherical aperture (in spot or scanning disk confocal microscopy) or an image sensor with a spherical surface which matches the spherical aberation of the optics substantial cost and performance benefits may be obtained.

Once an area for inspection is located with the low magnification confocol microscopy scan, then the user issues with control terminal 116 a medium magnification zoom control signal for directing a medium magnification optical microscopy scan of the object 104 in this area. The scanning control routine 122 controls the XY translator 110 to position the tip 132 over the object 104 in the area specified by the zoom control signal and then low magnification optical microscopy measurements are made in this area in the way described earlier (block 202). This is done to find a smaller area to zoom in on for even closer inspection.

After this smaller inspection area is located, the user issues with control terminal 116 a high magnification zoom control signal for directing a high magnification scan of the object 104 in this area. In doing so, the scanning control routine 122 controls the XY translator 110 so that the tip 132 is sequentially positioned at numerous scan points over the object 104 during the scan.

When the AFM mode has been selected as the primary high magnification mode by the user with the control terminal 116, a flag is set in the data base 198 indicating this. In response to this flag, the scanning control routine 122 directs the Z translator 110 to position tip 132 over the object 104 for an AFM measurement at each scan point in the way described earlier (block 206). The data processed by the AFM analysis routine 137 representing these AFM measurements is then recorded in the data base 198.

Alternatively, when object 104 is a conductive material, the user may select the STM mode as the primary high magnification mode. In this case, the scanning control routine 122, in response to a flag stored in the data base 198 indicating that the STM mode is the primary high magnification mode, directs the Z translator 110 to position tip 132 over the object 104 at each scan point for an STM measurement at each scan point (block 206). These STM measurements are made in the way described earlier and the combined data representing them is processed by the STM analysis routine 138 and recorded in the data base 198. When combined, the recorded data provides the basic high magnification image data of object 104.

After a primary high magnification measurement is made at a scan point, the scanning control routine 122 determines whether to make at this same scan point a secondary high magnification STM measurement (in the case where the primary high magnification mode is the AFM mode) or AFM measurement (in the case where the primary high magnification mode is the STM mode). The scanning control routine 122 accomplishes this by determining if a predefined number N of scan points have occurred since the last secondary STM measurement (in the case where the primary high magnification mode is the AFM mode) or the last secondary AFM measurement (in the case where the primary high magnification mode is the STM mode) (decision block 208). This predefined number N may be selected by the user with the control terminal 116.

If scanning control routine 122 determines that the scan has been incremented by N scan points since the last secondary high magnification STM or AFM measurement, then it controls the making of such a measurement in the way described earlier (block 210). The data representing this measurement is processed by the STM or AFM analysis routines 137 or 138 and then stored in the data base 198. This data provides additional information or image data on local variations of composition or conductivity at the current scan point.

After the secondary measurement has been made at the current scan point, or after scanning control routine 122 determines that such a measurement should not be made at this scan point, it then determines based on the primary high magnification AFM or STM measurement whether a deep surface feature is immediately under the tip 132 if it already has not determined that an anomaly exists at the current scan point (decision block 212). Similar to the way in which an anomaly is detected, this is done by analyzing the data contained in the signal received from the cantilever deflection measurement circuit 135 (when the AFM mode is the primary magnification mode) or the tunneling current measurement circuit 158 (when the STM mode is the primary magnification mode) and comparing it with predefined data stored in memory 124 corresponding to a deep surface feature.

If scanning control routine 122 determines that the received data does not compare with the stored data, then it has determined that a structure and not a deep surface feature is directly underneath tip 132. In this case, a near-field optical measurement is not made.

However, when the received data does compare to the stored data, then scanning control routine 122 has determined that a deep surface feature is underneath tip 132 at the current scan point. In this case, the scanning control routine 122 then controls the making of a near-field optical microscopy measurement at this scan point in the way described earlier (block 214). The data produced by the near-field optical analysis routine 151 provides image data identifying the deep surface structure and is recorded in the data base 198.

After a near-field optical measurement has been made at the current scan point, or if it is determined that such a measurement is not to be made, then the scanning routine 122 determines whether a junction of surface structures or local change in surface structure exists at the current scan point (decision block 216). Similar to the deep surface feature determination described above, scanning control routine 122 determines this by analyzing the data contained in the signal received from the cantilever deflection measurement circuit 135 (when the AFM mode is the primary magnification mode) or the tunneling current measurement circuit 158 (when the STM mode is the primary magnification mode) and comparing it with predefined data stored in memory 124 corresponding to known types of structure junctions to determine if a structure junction is directly underneath tip 132.

If scanning control routine 122 determines that a junction of structures or a local change in structure is directly underneath tip 132, then it controls performance of a near-field spectrophotometric measurement, and/or a hardness testing measurement in the ways described earlier (block 218). The data produced by the analysis routines 143, 151, and 195 provides even more information or image data on local variations in composition at the current scan point and is recorded in the data base 198.

After a near-field spectrophotometric measurement, and/or a hardness testing measurement is made, or if scanning control routine 122 determines that a junction of structures or a local variation in structure is under tip 132 at the current scan point, then the scanning control routine 122 determines if the scan has been completed. This is done by determining if the current scan point is the last scan point of a predefined number of scan points M selected for the entire scan by the user with the control terminal 116.

If the current scan point is not the Mth scan point, then the scan is incremented to the next scan point and the above process is repeated until the Mth scan point is reached. However, if the current scan point is the Mth scan point, then the display routine 136 combines the data processed by the routines 137, 138, 151, 143, and 195 into a single high magnification image of the object in the way described later (block 220).

As one skilled in the art will appreciate, the user can increase the overall scan time by selectively setting flags in the data base 198 indicating which of the above described measurements should not be made during the scan. In response, the scanning control routine 122 will not control the performance of these types of measurements.

Moreover, those skilled in the art will appreciate that the scanning control routine 122 can be modified to make different types of measurements for different types of conditions and materials being inspected.

For example, the near-field optical mode, the near-field spectrophotometry mode, or the hardness testing mode may be made the primary measurement mode.

Or, scanning control routine 122 may also determine that secondary STM or AFM, near-field optical, spectrophotometric, or hardness testing measurements should be made if, based on the primary high magnification AFM or STM measurement, scanning control routine 122 determines that an anomaly exists at a current scan point. This is done similarly to the deep surface feature determination. Specifically, scanning control routine 122 analyzes the data contained in the signal received from the cantilever deflection measurement circuit 135 (when the AFM mode is the primary magnification mode) or the tunneling current measurement circuit 158 (when the STM mode is the primary magnification mode) and compares it with predefined data stored in memory 124 corresponding to known types of structures and surface features to determine if an anomaly is directly underneath tip 132.

Moreover, the criterion for making the various types of measurements described above may be based instead on the planarity of the specimen. Thus, the scanning control routine 122 would control the making of measurements in the magnification and measurement mode appropriate to the region under the tip 132. For example, scanning control routine 122 may control the transitioning from measurements in the low magnification confocol microscopy mode for a rapidly changing topography (e.g., 2 to 3 microns) to measurements in the high magnification AFM and/or STM mode for a region (e.g., n on a side) which might be expected to be locally planar, atomic, and/or conductive.

Display Control As shown in FIG. 12, the display routines 136 include a display formatting routine 520. The display routines 136 first obtain the zoom (i.e., magnification) level and type of image desired by the user. The user requests the zoom level and image type with control terminal 116 which issues command signals indicating the desired zoom level and image type. This signal is received by the CPU 120 and provided to the display formatting routine 520.

When the zoom level specifies the low magnification confocol microscopy mode or the medium magnification optical microscopy mode, the data formatting routine 520 formats the data provided by the low magnification analysis routine 139 or the medium magnification analysis routine 141. Depending on the zoom level and type of image requested by the user with the control terminal 116, the data formatting routine 520 formats the data for display as a 3D or 2D image of at least a portion of the object 104.

Similarly, when the zoom level specifies the high magnification microscopy mode, the data formatting routine 520 overlays and combines the recorded image data representing the various measurements made during the high magnification scan into a single high magnification 3D or 2D image of at least a portion of the object 104 depending on the desired image type requested by the user. This is done using conventional data processing techniques, as suggested earlier. In this way, the data produced by the AFM or STM analysis routines 137 or 138 representing the primary high magnification measurements provides the basic image data. This basic image data is augmented with data produced by the near-field optical analysis routine 151 providing image data on deep surface features. It is also augmented with data produced by the STM or AFM analysis routines 138 or 137 representing the secondary high magnification measurements and providing image data on local variations in the composition or conductivity of object 104. Moreover, the basic image data is augmented with data produced by the spectrophotometric and hardness testing analysis routines 143 and 195 providing further image data on local variations of the composition of object 104.

The display 118 then receives the formatted image data from the CPU 120. In response, it then displays the formatted image data.

Referring again to FIG. 12, the display routines 136 include a color mapping (or assigning) tool routine 521. The program used to implement the color mapping tool routine 521 is listed in Appendix A. The user selects and operates the color mapping tool routine 521 by issuing appropriate commands with the terminal 116. Thus, the color mapping tool routine 521 is responsive to commands issued by the user with the terminal 116 such that the user can map a specific range of data elements to a specific range of colors.

Figure 13A:
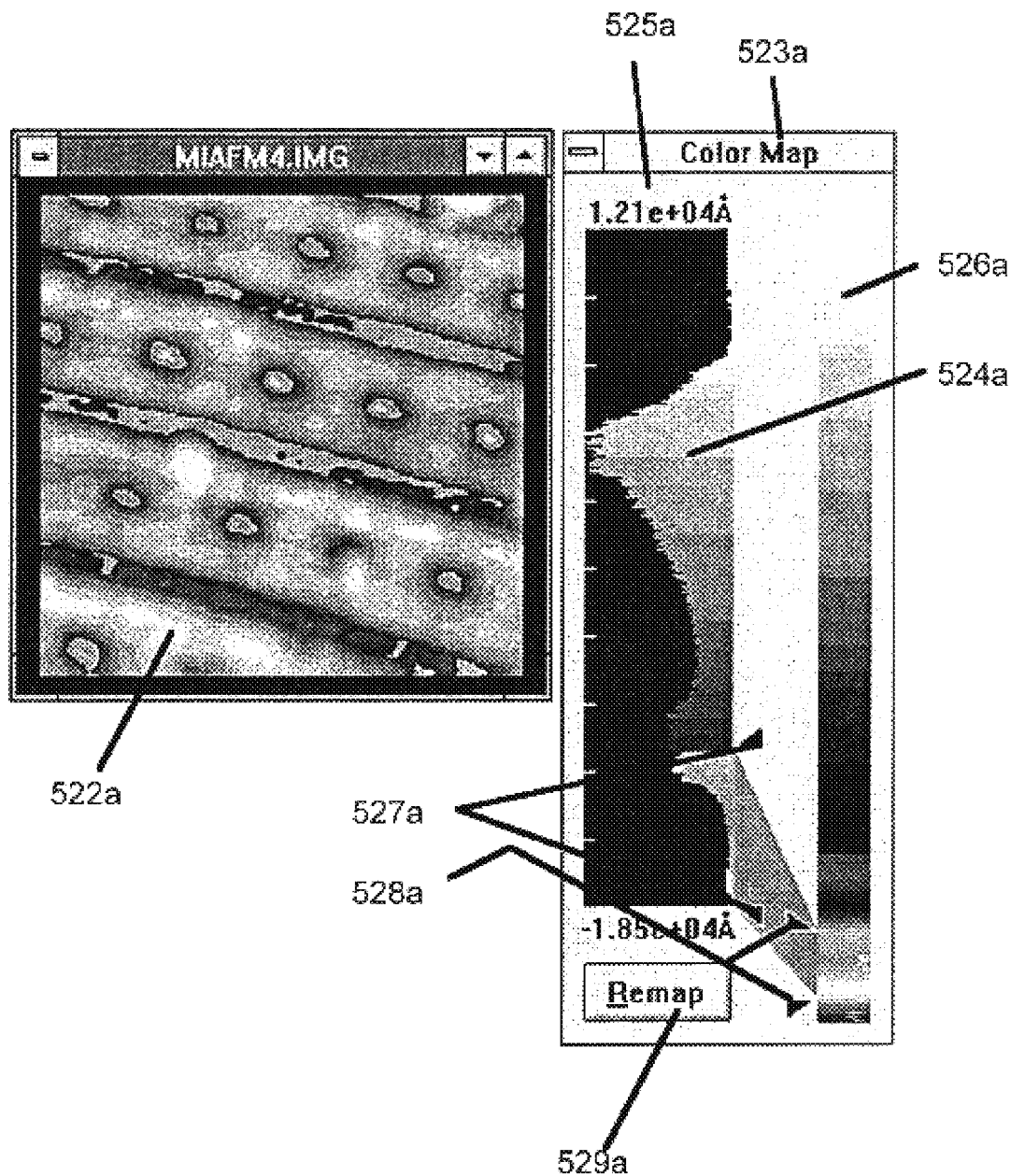
FIGS. 13a–13c and 14–25 show images created by the display routines of FIG. 12.

Specifically, as shown in FIG. 13a, when the user selects the color mapping tool routine 521, it generates a color mapping tool 523a of the image 522a of object 104 currently being displayed by the display 118. Although the image 522a shown in FIG. 13a is a 2D image, those skilled in the art will recognize that the image of object 104 displayed by the display may also be a 3D image. The data representing the color mapping tool 523a is formatted by the data formatting routine 520 for display and provided from the CPU 120 to the display 118 which then displays the color mapping tool 523a. The image 522a and the color mapping tool 523a may be displayed in window fashion such that they may be displayed simultaneously together or separately at the command of the user with the terminal 116.

The generated color mapping tool 523a includes a histogram 524a of the image data of the image 522a. The histogram 524a sorts all of the topographic data points of the image data by their heights in the z direction (i.e., z values). The vertical axis of the histogram 524a is a linear range of the z values bounded by the max and min values 525a. The horizontal axis indicates for each z value how many data points of the image data have that z value.

The color mapping tool 523a also includes a vertical color strip (or bar or pallette) 526a that identifies a range of colors. The color mapping tool 523a initially (in the default condition) maps each z value in the histogram 524a to a corresponding color in the color strip 526a over a predetermined range of colors in the color strip 526a. The color mapping tool routine 521 provides the color assignments to the data formatting routine 520 which formats the image data for display of the image 522a with these color assignments.

As shown in FIG. 1, the terminal 116 includes a pointing device 117 such as a mouse, joy stick, track ball, or other multi-axis device. The color mapping tool 523a includes z value range identifying cursors 527a and color range identifying cursors 528a. The color mapping tool routine 521 is responsive to commands issued with the pointing device 117 such that a user can manipulate the cursors 526a and 527a with the pointing device 117 to identify a specific range of z values in the histogram 524a to be mapped to a specific range of colors in the color strip 526a. When the user selects the Remap button 527a of the color mapping tool 523a with the pointing device 117, the histogram 524a is updated with the new color assignments and the color mapping tool routine 521 provides the new color assignments to the data formatting routine 520 for formatting the image data to update the image 522a with the new color assignments. Thus, using the color mapping tool routine 521, the user may linearly map a large or small range of colors to a range of z values to visually amplify or de-amplify changes in z. Although a conventional 24 bit display can display 16 million colors, the color strip 526a in FIG. 13a may include only a specific range of these colors.

Figure 13B:
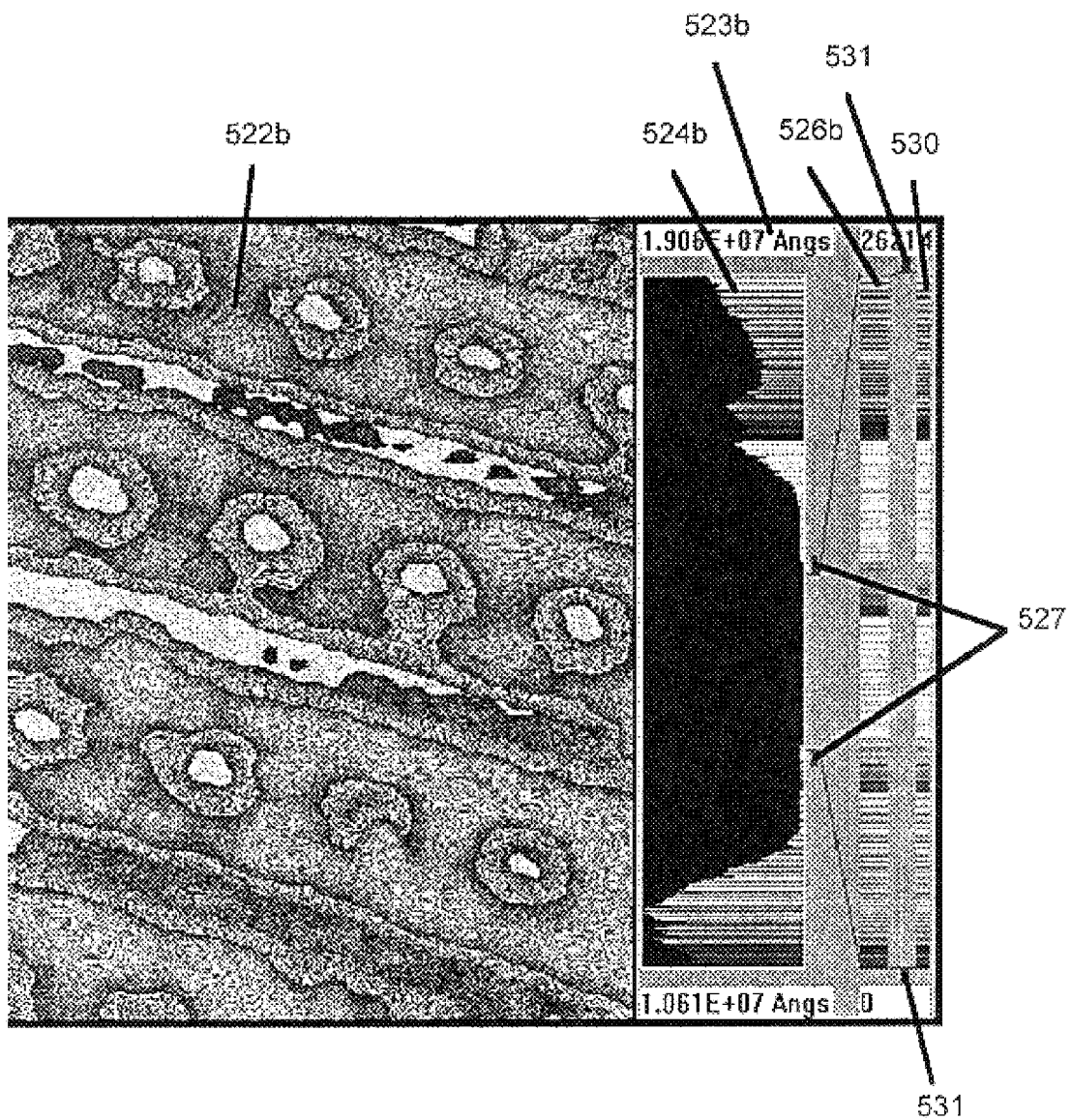

Therefore, as shown in FIG. 13b, in order to be able to select color ranges from the entire set of 16 million colors, the color mapping tool routine 521 may include a color mapping tool 523b that has a base color strip 530 that identifies all 16 million colors. In addition, the color mapping tool 523b includes a magnifying color strip 526b which is similar to the color strip 526a. The user then can manipulate the base color range identifying cursors 531 with the pointing device 117 to select a range of colors in the base color strip 530 which is magnified by the magnifying color strip 526b to show the various colors in the selected range. The user then manipulates the cursors 527b and 528b to map a specific range of the magnified colors to a specific range of z values in the same way as described earlier.

Furthermore, the base color strip 530 may be configured such that each individual color is layered sequentially in the color strip 530 as a darkened version of the color below the color below a lightened version of the color. This forms color bars each having corresponding z values such that image 522b is composed of a series of bars of dark and light colors making a topographic image of the surface of object 104. Since each color bar has a specific linear incremental z value corresponding to it, it represents a precise measure of the change in the z direction of the image 522b.

Figure 13C:
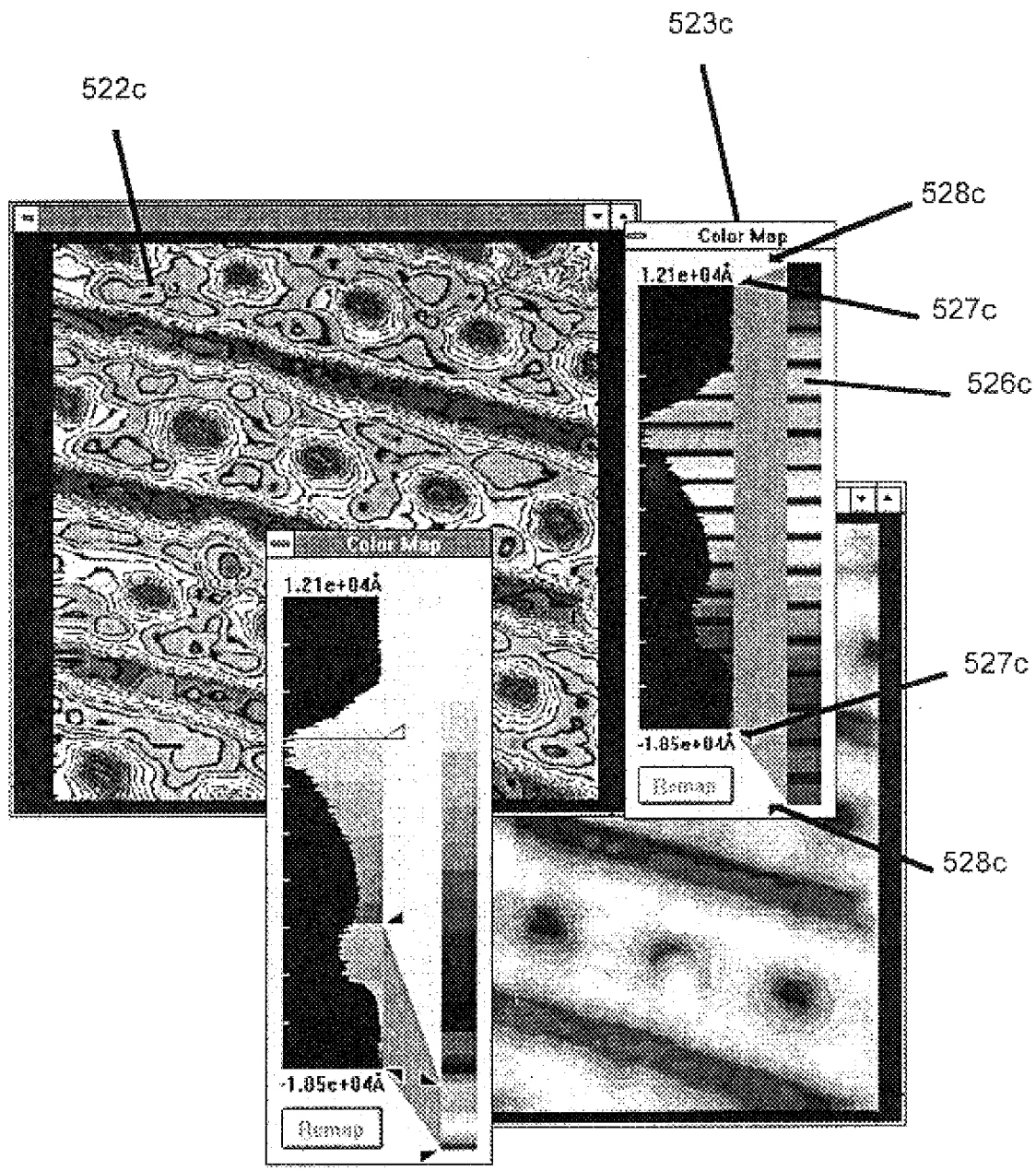

Alternatively, as shown in FIG. 13c, the color strip 526c may be configured such that the same small range of dark colors occurs between larger ranges of lighter colors. The ranges of lighter colors are the same length in z such that the image 522c is composed of larger ranges of lighter colors separated by the small range of dark colors. Since the range of dark colors separate the larger ranges of lighter colors at equal distances, this provides a topographic image of the object 104 and provides a precise measure of the change in the z direction of the image 522c.

Figure 14:
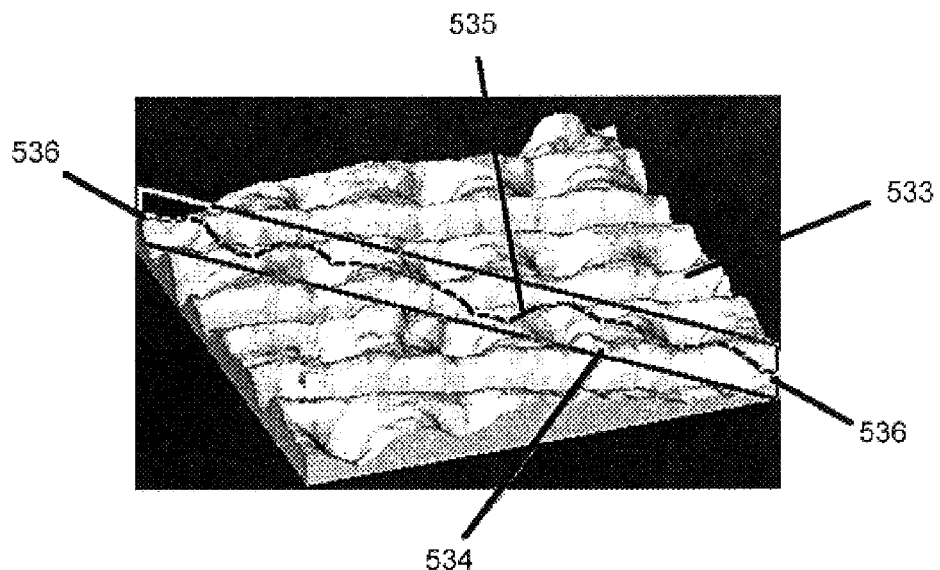

Turning to FIG. 12 again, the display routines 136 also include a 3D surface measuring tool routine 532 which can be used when a 3D surface image of object 104 is displayed by the display 118. Such a 3D surface image 533 is shown in FIG. 14 and produced when the user has selected the high magnification microscopy mode (i.e., AFM, STM, near-field optical, and hardness testing measurements). The user selects and operates the 3D measuring tool routine 532 by issuing appropriate commands with the terminal 116. The 3D measuring tool routine 532 is therefore responsive to commands issued by the user with the terminal 116 for making surface related measurements of the image 533.

Specifically, as shown in FIG. 14, when the user selects the 3D surface measuring tool routine 532, it generates a cutting plane (or ruler) 534 formed by a rectangle projected on the image 533. Since the image 533 does not include interior imaged data points, the cutting plane 534 includes a single line 535 that delineates where the 3D surface image 533 is intersected by the cutting plane including the portions of the image 533 which are not visible. The data representing the image 533 and the cutting plane 534 is formatted by the data formatting routine 520 and provided from the CPU 120 to the display 118 which then displays the cutting plane 534 so that it is projected on the image 533.

The 3D surface measuring tool routine 532 is responsive to commands issued with the pointing device 117 such that a user can select and manipulate the end points 536 of the cutting plane 534 to position the cutting plane with respect to the image 533. When selected, the end points 536 of the cutting plane 534 are circular magnifying cursors with cross hairs (similar to that shown in FIG. 17) for accurate positioning of the end points 536 of the cutting plane 534. The magnification of the cursors is selectable by the user with the terminal 116. Thus, since the 3D surface measuring tool routine 532 slices and delineates the 3D surface image 533 in real time, it gives the user a very rapid method for probing any surface feature of the object 104.

Figure 15:
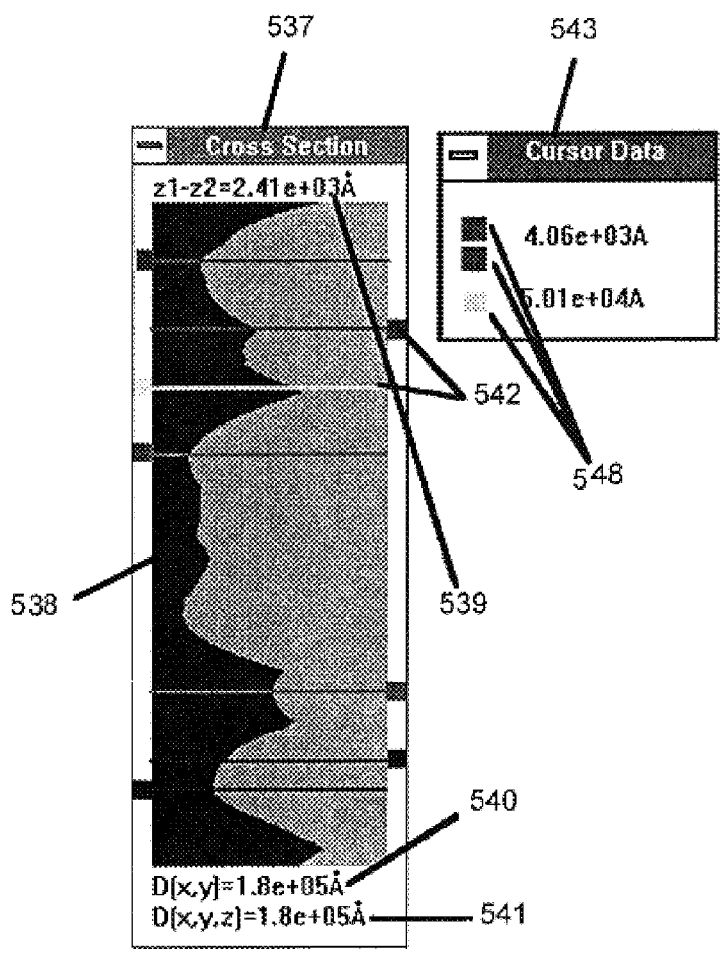

After the cutting plane 534 is positioned by the user with the pointing device 117, the 3D surface measuring tool routine 532 generates cross section data corresponding to the cross section of the image 533 along the intersection of the cutting plane 534 and the image 533. Referring to FIG. 15, the cross section data is formatted for display by the data formatting routine 520 and provided by the CPU 120 to the display 118 for display. The 3D surface image 533 and the cross section information 537 may be displayed in window fashion such that they may be displayed simultaneously together or separately at the command of the user with the terminal 116.

The cross section information 537 includes a 2D cross sectional image 538 along the intersection of the cutting plane 534 and the image 533. The cross section information 537 includes the surface height difference 539 at the end points 536 of the cutting plane 534, the absolute length 540 of the cutting plane 534 in the x,y plane, and the length 541 of a line extending between the surface points of the cross sectional image 538 at the end points 536 in terms of the x,y,z coordinates.

Moreover, the cross sectional information 537 includes cursors 542 and to make absolute and relative measurements of the separation and angle of surface points intersection or interior points. The 3D surface measuring tool 533 is responsive to commands issued with the pointing device 117 such that a user can manipulate the cursors 542 to make absolute and relative measurement of the difference in z values, separation in the x,y plane, and angle between surface points of the image 538.

The 3D surface measuring tool routine 532 generates cross section cursor data representing the measurements made with the cursors 542. The cross section cursor data is formatted for display by the data formatting routine 520 and provided by the CPU 120 to the display 118 for display of the cross section cursor information including the measurements 548 made with the cursors 542. The cross section cursor information 543 may also be displayed in window fashion along with the 3D surface image 533 and the cross section information 537.

Figure 16:
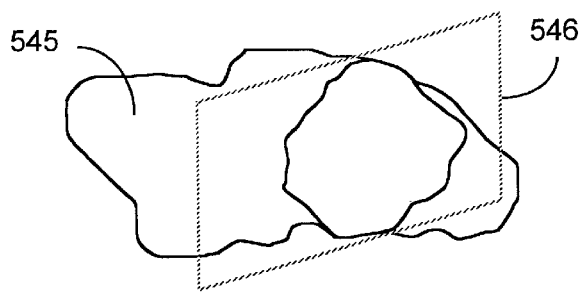

Turning to FIG. 12 again, the display routines 136 also include a 3D volume measuring tool routine 544 which can be used when a 3D volume image of object 104 is displayed by the display 118. Such a 3D volume image 545 is shown in FIG. 16 and produced when the user has selected the low or medium magnification microscopy mode (i.e., confocol or infrared optical measurements). The 3D volume measuring tool routine 544 is similar to the 3D surface measuring tool routine 532 and, like it, the user selects and operates the 3D volume measuring tool routine 544 by issuing appropriate commands with the terminal 116 for making 3D volume related measurements of the image 545.

Figure 17:
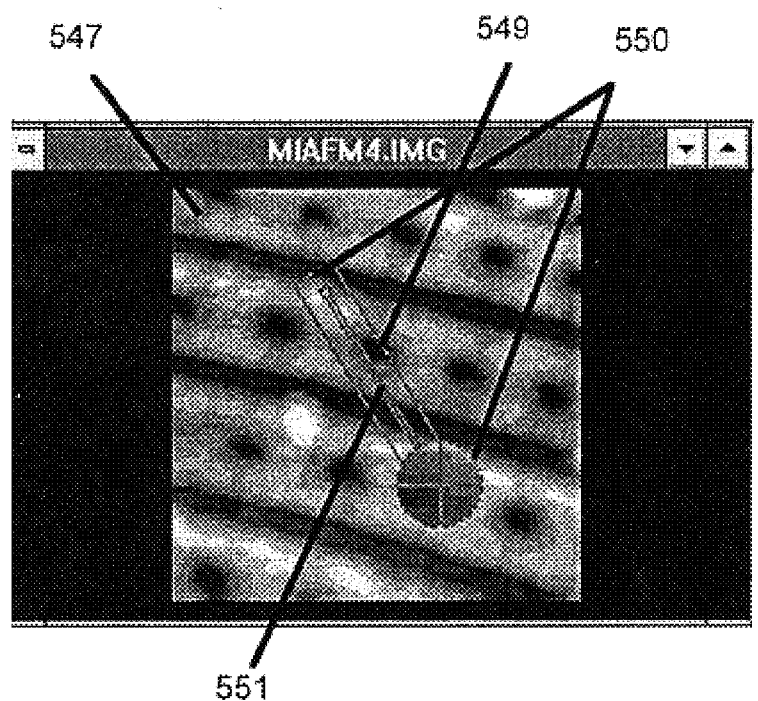

The cutting plane 546 of the 3D volume measuring tool routine 544 is positioned by the user with the pointing device 117 in the same way as with the 3D surface measuring tool routine 532. After the cutting plane 546 is positioned, the portion of the image 545 between the user's viewpoint and the cutting plane 546 is made transparent with only the silhouette of its surface visible to the user. Furthermore, after the cutting plane 546 is positioned, the 3D volume measuring tool routine 544 also generates cross section data corresponding to the cross section of the image 545 at the intersection of the cutting plane 546 and the image 545. However, in this case the cross section data includes information about interior data points of the cross section. Referring to FIG. 17, the cross section data is formatted for display by the data formatting routine 520 and provided by the CPU 120 to the display 118 for display as a 2D cross sectional image 547. The 3D volume image 545 and the 2D cross sectional image 547 may be displayed in window fashion such that they may be displayed simultaneously together or separately at the command of the user with the terminal 116.

As shown in FIG. 12, the display routines 136 include a 2D measuring tool routine 548 which can be used on the 2D cross sectional image 547, as well as any other 2D image of object 104 displayed by the display 118. The user selects and operates the 2D measuring tool routine 548 by issuing appropriate commands with the terminal 116 for making 2D related measurements of the image 547 As shown in FIG. 17, when the user selects the 2D measuring tool routine 548, it generates a flat ruler 549 formed by a rectangle projected on the image 547. The data representing the image 549 and the ruler 549 is formatted by the data formatting routine 520 and provided from the CPU 120 to the display 118 which then displays the ruler 549 so that it is projected on the image 547.

Similar to the cutting planes 534 and 546 of the 3D measuring tool routines 532 and 544, the end points 550 of the ruler 549 are magnifying cursors with cross hairs when selected by the user with the pointing device 117. Thus, the ruler may be positioned in the same way as was described for the cutting planes 534 and 546. After the ruler 549 is positioned, the 2D measuring tool routine 548 generates cross section data corresponding to the cross section of the image 547 along the inner region 551 of the ruler 549. This cross section data is generated, displayed, and measured in the same manner as that described earlier for the cross section information 537 shown in FIG. 15.

Figure 18:
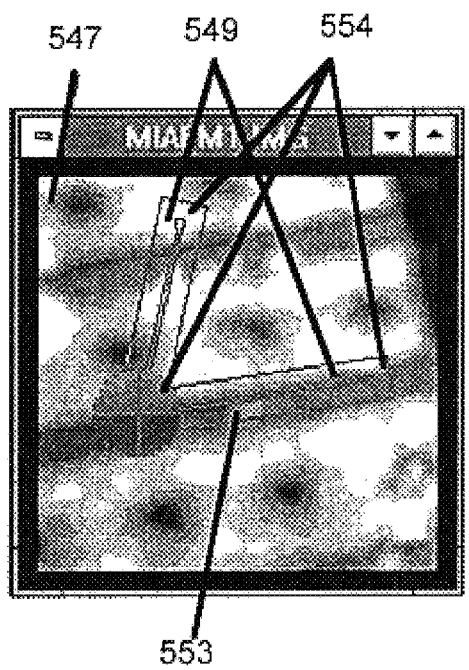

The display routines 136 also include a 2D angle measuring tool routine 552 for measuring angles between points of a 2D image. As shown in FIG. 18, when the user selects the 2D angle measuring tool routine 552, it generates an angle measuring tool 553 formed by two flat rulers (similar to ruler 549 described earlier) joined at one of the end points 550 and projected on the image 547. The data representing the image 547 and the angle measurer 553 is formatted by the data formatting routine 520 and provided from the CPU 120 to the display 118 which then displays the angle measuring tool 553 so that it is projected on the image 547.

As with each ruler 549, the end points 550 of the ruler 549 are magnifying cursors with cross hairs when selected by the user with the pointing device 117. Thus, the end points 550 may be positioned in the same way as was described for the end points 550 of the ruler 549 of FIG. 17. After the end points 550 are positioned, the 2D angle tool routine 552 generates angle data representing the angle formed between the inner regions of the two rulers of the angle measurer 553. The angle data may then be generated and displayed like the cursor data 543 of FIG. 15. Those skilled in the art will appreciate that one of the rulers of the angle measurer 533 could be used as the ruler 549 of the 2D measuring tool 548.

The program used to implement the 3D surface measuring tool routine 532, the 3D volume measuring tool routine 544, the 2D measuring tool routine 548, and the 2D angle measuring tool routine 552 is listed in Appendix of the microfiche appendix.

The display routines 136 further include a Fast Fourier Transform (FFT) routine 560 for filtering a 3D image, such as image 533 or 545 shown in FIG. 14 or 16. The program used to implement the FFT routine 560 is listed in Appendix C of the microfiche. The user selects and operates the FFT routine 560 by issuing appropriate commands with the terminal 116.

Figure 21:
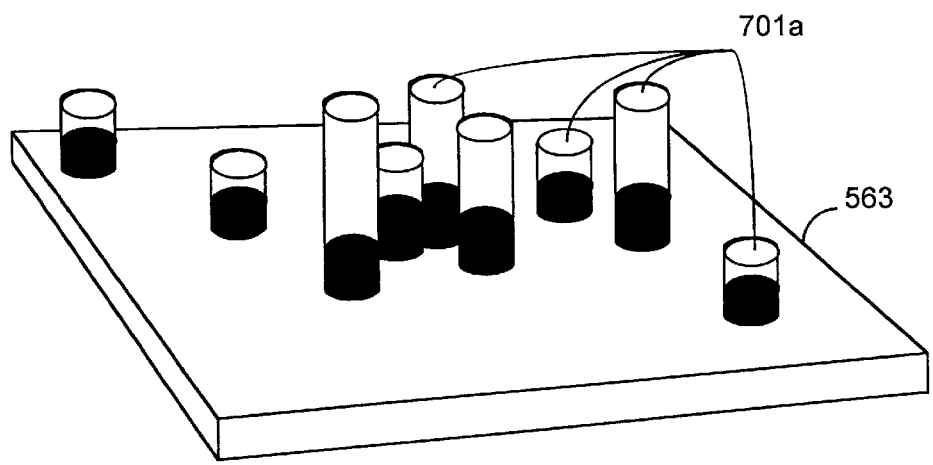
Figure 19:
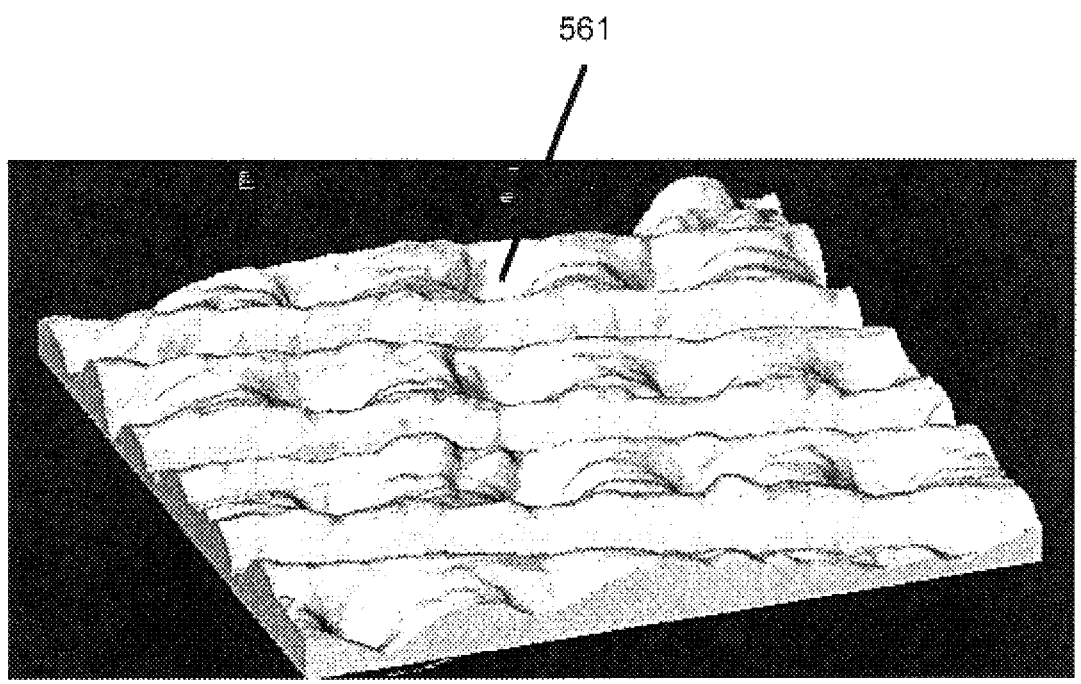
Figure 20:
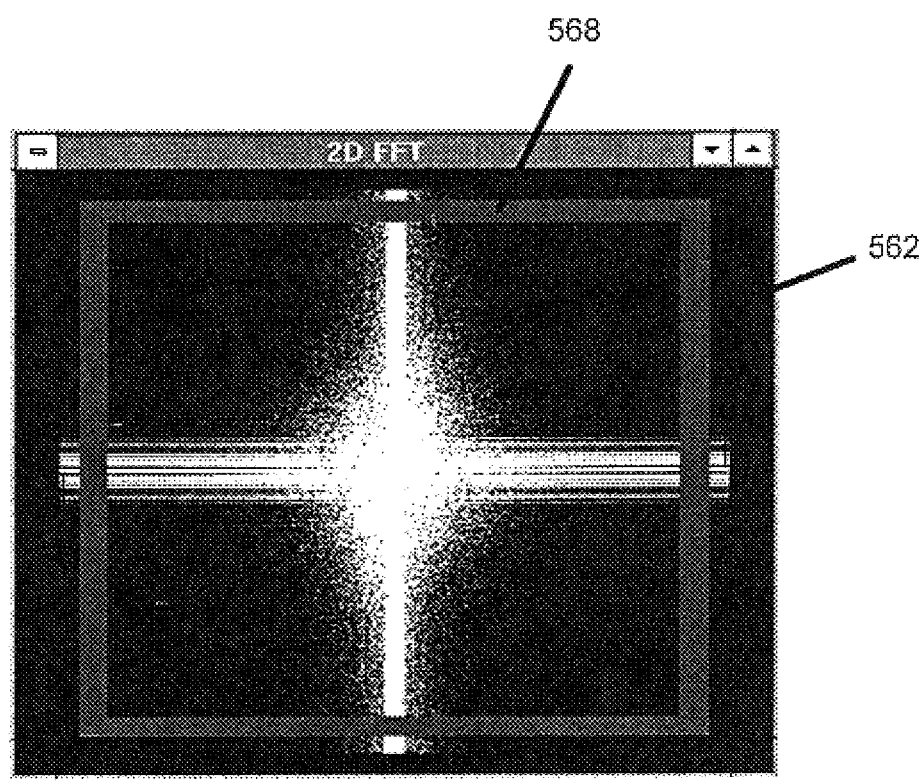

Referring to FIG. 19, when the user selects the FFT routine 560, it generates a 2D FFT of the 3D image 561 currently being displayed by the display 118 and a 3D projection of the 2D FFT. The data representing the 2D FFT and the 3D projection are formatted by the data formatting routine 520 and provided from the CPU 120 to the display 118 which then displays the 2D FFT as the 2D FFT image 562 shown in FIG. 20 and the 3D projection as the 3D FFT image 563 as shown in FIG. 21. The displayed FFT images 562 and 563 provide a mapping of the spatial frequency of the structural elements of the 3D image 561. The 3D image 561, the 2D FFT image 562, and the 3D FFT projection image 563 may be displayed in window fashion such that they may be displayed simultaneously together or separately at the command of the user with the terminal 116.

Figure 23:
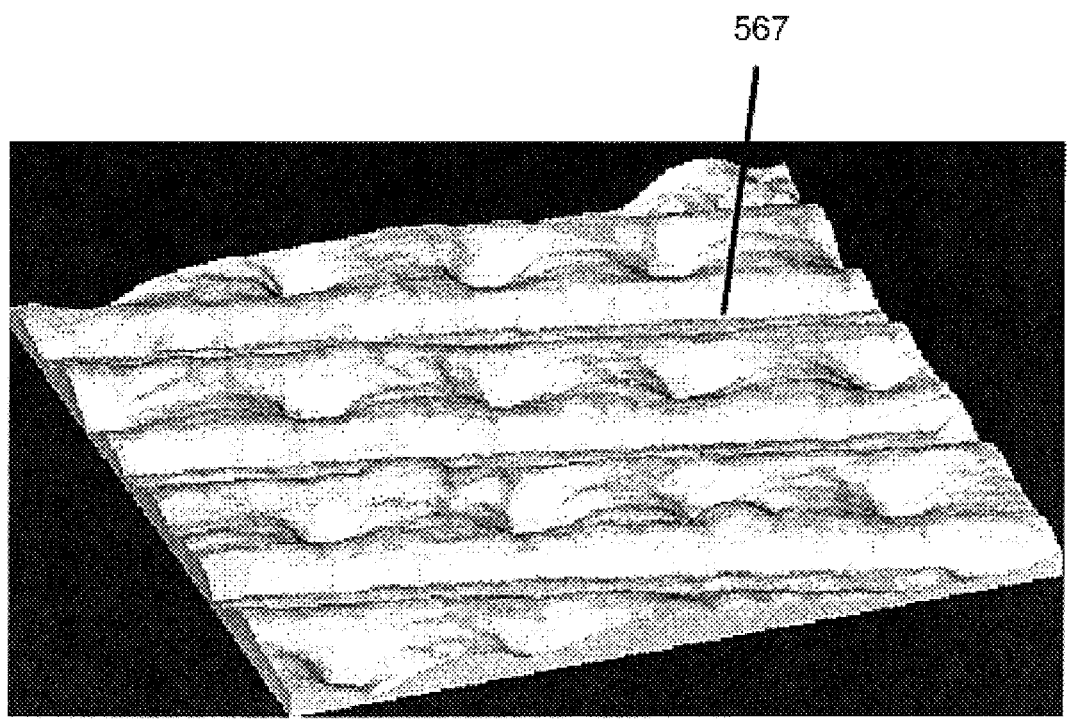

In the 3D FFT image 563, each FFT node of the 2D FFT is a peak whose height (in z) is directly related to its magnitude (or intensity). Thus, the 3D image 563 may then be colored using the color mapping tool routine 521 described earlier. In this way, low magnitudes are colored darker than greater magnitudes so as to establish a floor above which are the principle peaks (FFT nodes) of the original space domain image 561. The FFT routine 560 then makes an individual inverse transform of the data group representing each light colored peak region above the floor which are then all linearly summed together with a single inverse transform of the data group representing all the dark colored regions below the floor to form the image data for the 3D image 567 in FIG. 23.

Figure 22:
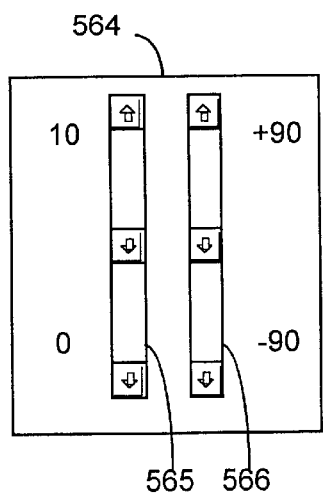

The FFT routine 560 generates data representing a control panel. The data is formatted by the data formatter and the control panel 564 is displayed by the display 118 as shown in FIG. 22. The user then uses the pointing device 117 to select particular peaks of the 3D FFT image 563 and then manipulate the control bar 565 to increase or decrease the magnitude of the selected peak and the control bar 566 to vary the phase of the selected peak. This permits the user to change the magnitude and phase of each peak using the on screen controls while seeing the change in the resulting image 567 when the transform data group for the peak is changed in response. In modest performance computing platforms even very complex images can be examined by this means in real time (changing for the user as fast as he manipulates the controls).

Additionally, with the pointing device 117, the user can select or create regions (or masks) of the 2D FFT image 562 covering specific spatial frequencies so that structures of spatial frequency within the region can be selected for filtering or amplification by the user. The 2D FFT tool generates the data representing.a region and the data formatting routine 520 formats the data so that the region 568 is projected on the 2D FFT image 562 by the display 118. The user then changes the inverse transform data group for the region by using the pointing device 117 to manipulate the control bar 565 of the control panel 564 to increase or decrease the magnitude of the spatial elements within the created region and the control bar 566 to vary the phase of the spatial elements within the created region. Thus, the user can create any shape or number of regions on the 2D FFT in which the magnitudes and phases can be varied continuosly. In addition the 2D FFT is calibrated in spacial freguencies each of which are displayed next to the 2D FFT so that structures of specific frequency can be selected while all others are demphasized or eliminated.

Furthermore once created the regions 568 form separate FFT masks which can be stored and recalled in data base 198 by the user for reuse with other images in which the regions will automatically size themselves to conform to the spacial characteristics of the new image. That is the regions forming the masks carry the specific spacial frequency information they were formed with and scale according to the range of the image to which they are applied. Thus if a region spanned 2 units square on a ten unit image it would scale down linearly for a 100 unit image and up linearly for a 5 unit image. Therefore these regions have a radial mirrored symmetry directly related to the mirror symmetry of the FFT.

Figure 24:
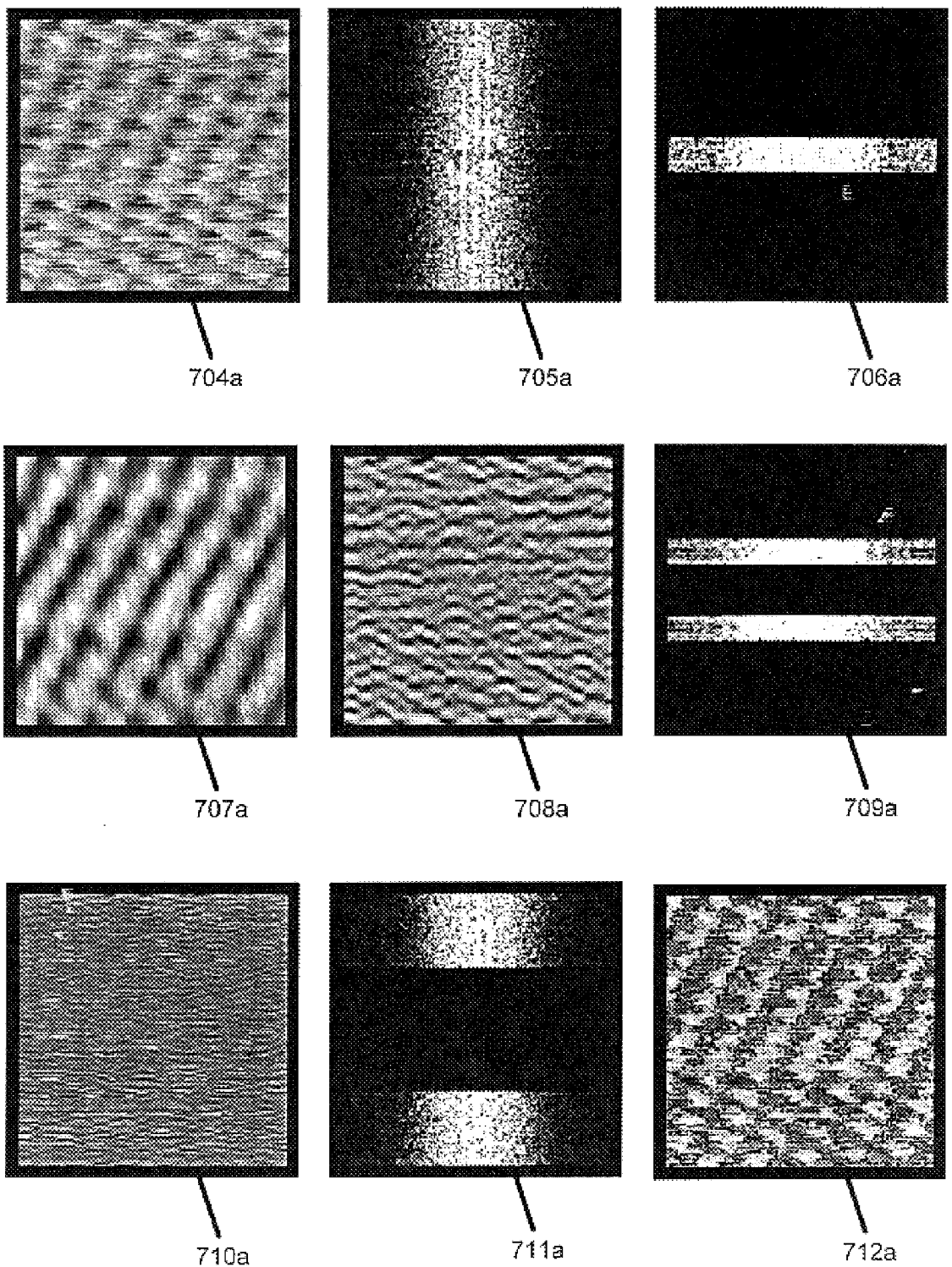

FIG. 24 shows a sequence of masks 705a, 706a, 709a, and 711a and images 704a, 707a, 708a, and 710a used to create a particular FFT image 712a. Each mask is located next to its resultant image. The original image 704a has a null or no masking of the associated FFT image 705a. In addition, inverse image 710a is recolored so that the resultant sum image 712a of the inverse images 707a, 708a, and 710a shows the spacial components associated with the mask 711a in blue.

Figure 25:
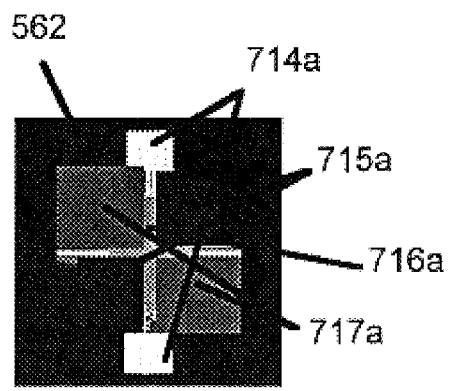

FIG. 25 shows an alternate way to create a multiregion mask on a 2D FFT image 562 by using regions which are drawn with the draw tools in separate colors 714a–717a. Again each region may be selected and the control panel 564 used to vary the sum inverse image in the users real time.

DESCRIPTION OF THE SECOND EMBODIMENT

Figure 26:
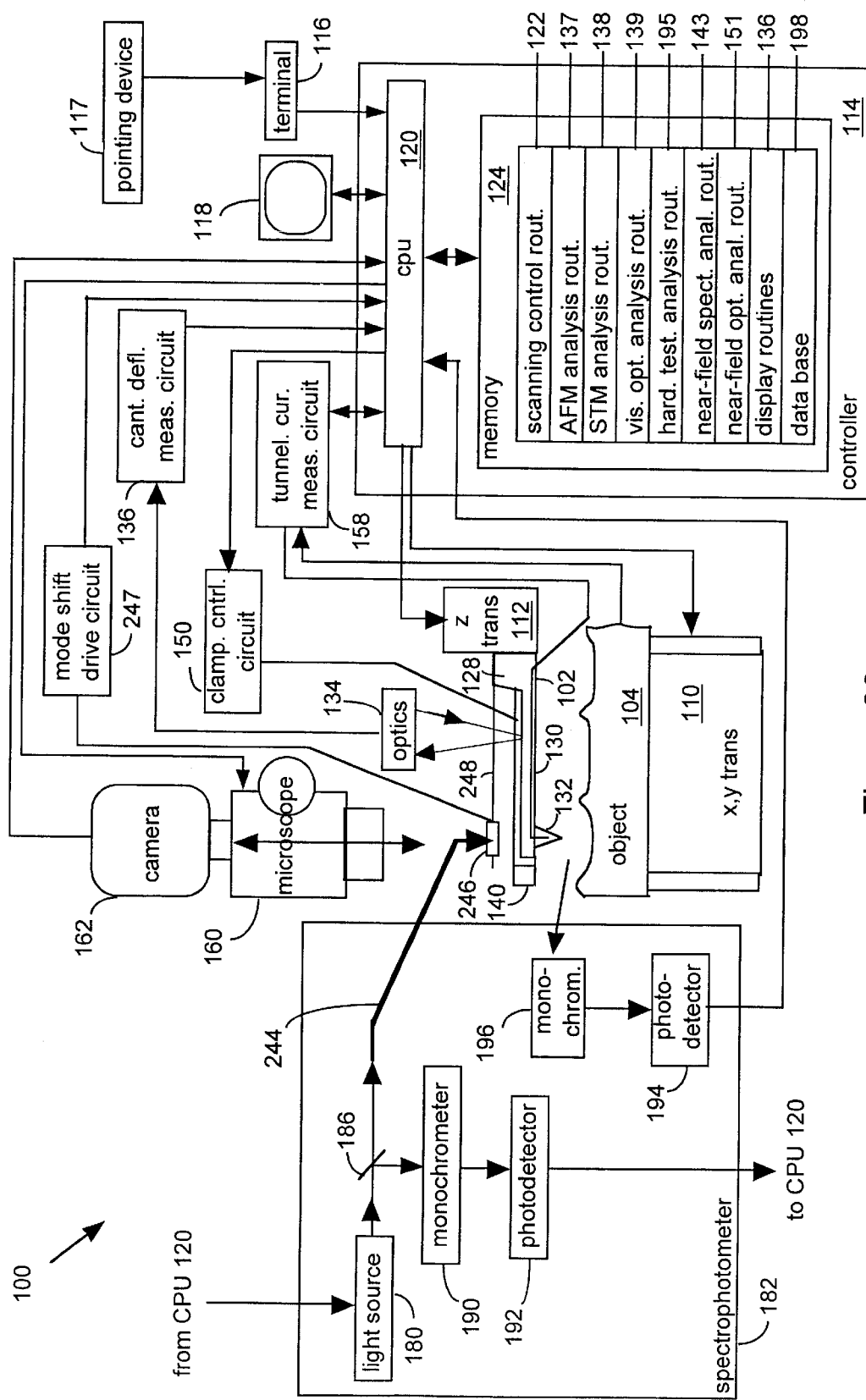
FIG. 26 shows another conceptual view of a scanning probe microscope assembly in accordance with the present invention.

Referring to FIG. 26, there is shown a conceptual diagram of another embodiment of a scanning probe microscope assembly 100 in accordance with the present invention. In this embodiment, scanning probe microscope assembly 100 includes a fiber optic light guide 244 for guiding the light provided by the light source 180 to the probe 102.

Figure 27A:
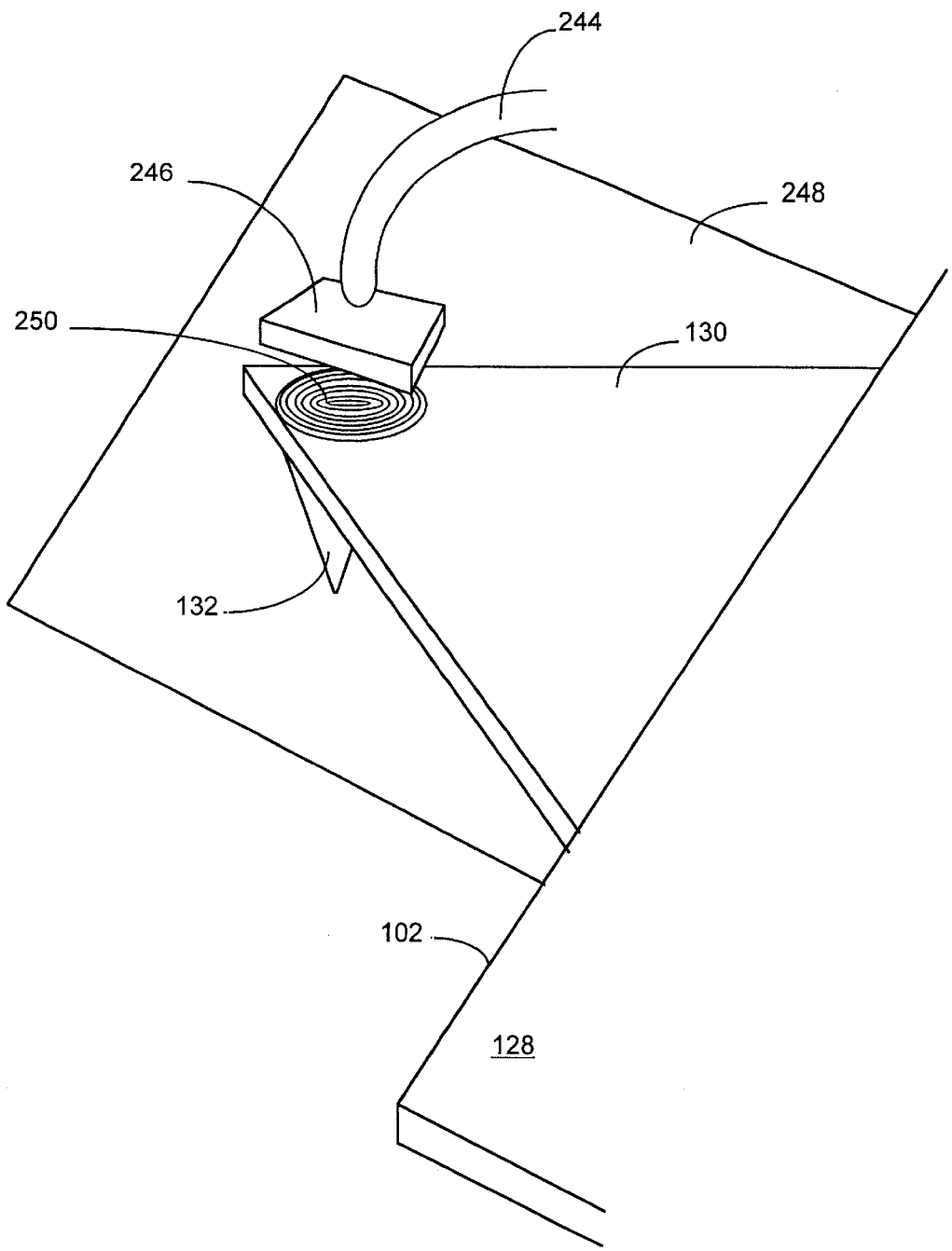
FIGS. 27a shows the probe of the scanning probe microscope assembly of FIG. 26 with a mode shifter and a fresnel lens over the tip of the probe.
Figure 27B:
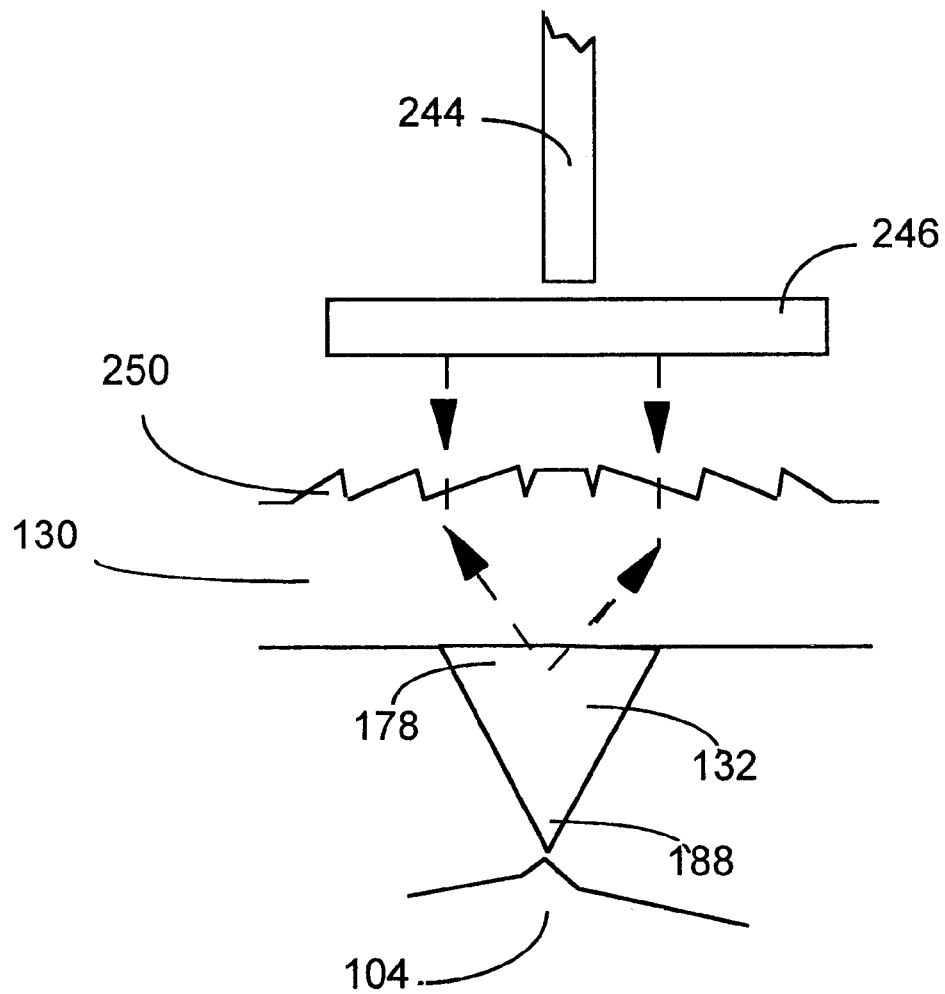

As shown in FIGS. 27a and 27b, the light guide 244 is optically coupled to an electro-optic mode shifter 246. Referring to FIG. 27a, the mode shifter 246 is held and supported by a thin support 248 connected to the base 128 of the probe 102 and is disposed over the fine fresnel lens 250 formed in the cantilever 130. The support 248 is transparent to visible light.

The electro-optic mode shifter 246 may be a plane polarizer on top of a liquid crystal in conjunction with a wave plate and is connected to the light guide 244 with optical cement. The plane polarizer of the mode shifter 246 plane polarizes the light received from the light guide 244. At the same time, the scanning control routine 122 generates control signals for controlling the mode shift drive circuit 247 to apply a variable voltage to the liquid crystal. In response to the applied voltage, the liquid crystal rotates the plane polarized light and the wave plate in response alternatingly produces right circular, elliptical, and left circular polarized light provided to the frensel lens 250. In other words, the mode shifter 246 continuously changes the polarization state of the light provided by the light source 180 during the near-field optical mode.

Alternatively, a mechanically rotatable plane polarizer such as polarizer 184 of FIG. 1 may be used to rotationally polarize the light provided by the light source 180. In this configuration, the mode shifter 246 includes only the wave plate. When scanning control routine 122 generates control signals for controlling the polarizer 184 to rotationally plane polarize the light provided to the mode shifter 246, then right circular, elliptical, and left circular light is alternatingly produced during the near-field optical mode by the wave plate of the mode shifter 246.

However, those skilled in the art will appreciate that other configurations may be employed for rotating or continuously changing the polar state of the light 185 during the near-field optical mode. For example, the mode shifter 246 may be entirely omitted with the light 185 being rotationally polarized as was described for the configuration of FIG. 1. Also, the mode shifter 246 may include a ferro-optic liquid crystal (with the wave plate being omitted) that may be electrically excited to change the polarization state. Or, the mode shifter may be a Pockels cell (with the wave plate being omitted) that may be excited with an electric field to change the polarization state. Moreover, a mechanically rotatable Glan prism may be used.

Referring to FIG. 27*b*, the light 185 provided by the light guide 244 to the mode shifter 246 is passed to the fresnel lens 250 and then focussed within the base 178 of the tip 132 by the fresnel lens 250. As was indicated earlier, the light 185 focused within the base 178 propagates through the tip 132 and is emitted at the sharp end 188 of the tip 132. The emitted light 185 optically interacts with the object 104 and the sharp end 188 of the tip 132 captures the resulting light due to the optical interaction of the emitted light with the object 104. This light propagates back through the tip 132 to the fresnel lens 250 which provides it to the mode shifter 246. From there, it is provided to the light guide 244 which guides the light back to the spectrophotometer 180 for spectrophotometric measurements in the same way as was described earlier. Moreover, photoemissive energy due to the optical interaction is detected by the photodetector 194 as was the case in the embodiment of FIG. 1.

This embodiment includes all of the modalities described above for the embodiment of FIG. 1 except the medium magnification mode.

DESCRIPTION OF THIRD EMBODIMENT

Figure 28:
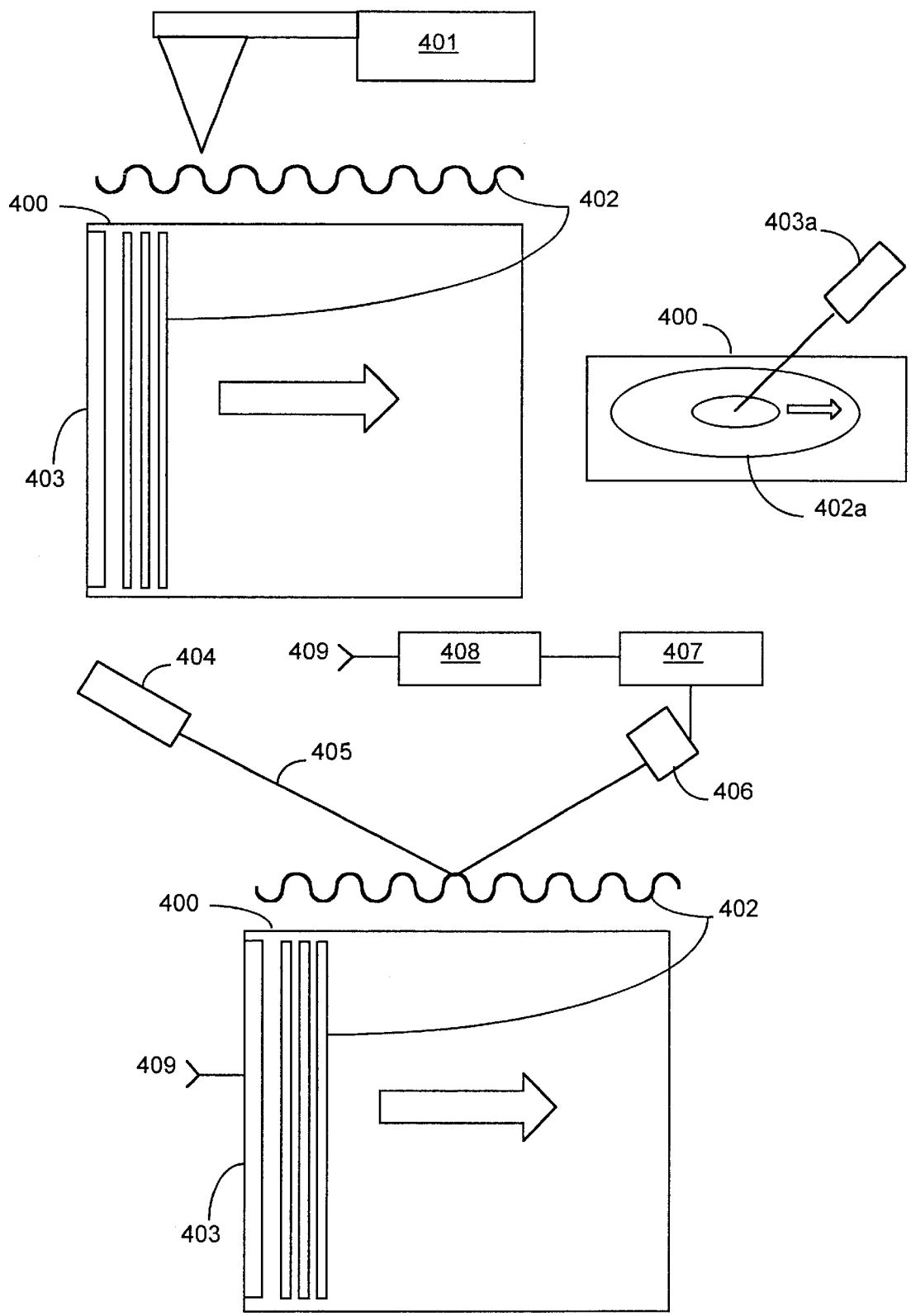
FIG. 28 shows an atomic force microscope probe sensing an acoustic wave in accordance with the present invention.

FIG. 28 shows an Atomic Force Microscope probe 401 sensing an acoustic wave 402 propagating to the right and generated by piezoelectric exciter strip 403 on glass semiconductor mask specimen 400. In one mode of operation the acoustic wave is generated continuously and in conjunction with reflections from the edges of the specimen forms standing acoustic waves on the surface at the acoustic excitation wavelength. After scanning a line the data is fourier transformed and the component of the transform at the excitation frequency is masked and amplified (the magnitude is increased) and color coded (a separate color is assigned to this wavelength only) to provide a precise reference in the final specimen image. Alternately the acoustic signal may be pulsed at each point of the scan to provide a difference signal for each point of the scan and permit the position of the tip to adjusted according to the displacement measured by the reference acoustic wave. Clearly both techniques may be used sequentially or in selected portions of the scan.

Modulated laser 403*a* may also be used to excite an acoustic wave on the specimen 400 at point (or with proper beam shaping in a line, oval or rectangular area to create a parallel wave as in 402) to produce circular waves 402*a* whose generation could be made closer to the scanned area of the specimen and thereby overcome attentuation at very small wavelengths. Furthermore techniques for generation of picosecond and femtosecond pulses capable of generating acosutics wavelengths in the Angstrom range are well known to those in the art.

A calibration control system 404 through 409 can be used to drive the piezoelectric wave generator or acoustic excitation laser and modulator 403*a* at frequencies locked to a reference optical frequency. In operation a chopped monochromatic light source such as a laser 404 reflects light off the acoustic wave 402 (or 402*a*) on the specimen into a linear array (or square array) sensitive detectors 406. Due to the diffraction effects of the grating like structure formed by the acoustic wave 402 the diffraction angle will be sensitively limited by wavelength of the light and the acoustic grating spacing. Control circuit 407 (which acts to lock in the signal to chopping frequency of the source light, thus rejecting extraneous light sources) increases and decreases the acoustic drive frequency output by acoustic drive signal generator 408 to lock it to the reference optical frequency at any given diffraction angle. Multiple sensors within 406 aligned in the plane of the diffraction angle allow different angles (and thus acoustic wavelengths) to be selected and locked against the reference optical frequency. In addition the use of vernier acoustic excitation (exciting a beat frequency in the acoustic waves) allow any acoustic wavelength to be reference locked to the optical frequency.

DESCRIPTION OF FOURTH EMBODIMENT

Figure 29:
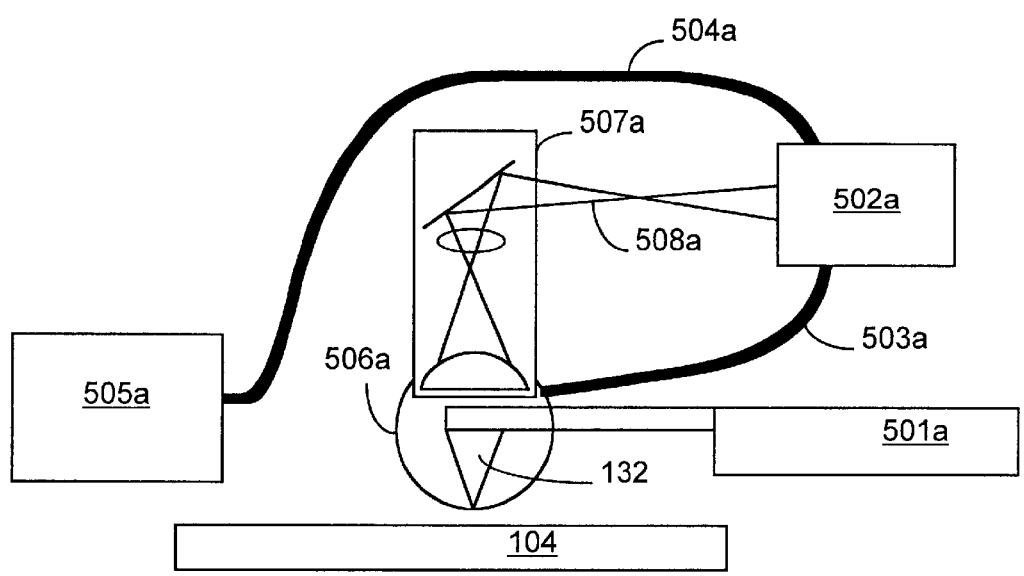
FIG. 29 shows a Mach-Zehnder interferometer for measuring the position of the tip of a scanning probe microscope.

FIG. 29 shows a Mach-Zehnder interferometer formed by two reference light sources 505*a* and 506*a* (such as two lasers operating at different visible or infrared wavelengths), two fiber optic guides 504*a* and 503*a*, which pick off part of the light from each laser 505*a* and 506*a* and combine with light 508*a* collected by optical system 507*a* from the tip 132 (in the manner described earlier) on cantelever 501*a* in dual detector 502*a*. The dual detector 402*a* splits the collected light 508*a* into constituent colors from each laser 505*a* and 506*a* and combines the split beam with light from each respective fiber 503*a* and 504*a* at independent high gain detectors (such as photomultpliers). The output of the dual detector 502*a* is used by a computing means to calculate the position of the tip 132, and may also be used by a computing means or position controller to reposition the tip 132 in a closed loop fashion.

While the present invention has been described with reference to a few specific embodiments, the description is illustrative of the invention and is not to be construed as limiting the invention. Furthermore, various other modifications may occur to those skilled in the art without departing from the true spirit and scope of the invention as defined by the appended claims.

What is claimed is:

1. A computer readable memory for directing a computer that is connected to a display and a pointing device to process first image data representing a first image, the computer readable memory comprising:

an angle measuring tool routine stored thereon and configured to:
generate second image data representing a second image of an angle measuring tool projected on the first image in response to the first image data, the angle measuring tool including endpoint cursors that can be manipulated with the pointing device to position the angle measuring tool on the first image to form an angle,
measure the formed angle; and
generate angle data representing angle information about the measured angle; and a data formatting routine stored thereon and configured to:
format the second image data for display of the second image on the display; and
format the angle data for display of the angle information on the display.

2. A computer readable memory as claimed in claim 1 wherein the endpoint cursors magnify the first image therearound to enable accurate positioning of the endpoint cursors.

3. A computer readable memory as claimed in claim 1 wherein the angle measuring tool comprises two rulers that each comprise two of the endpoint cursors and are joined at and share one of the endpoint cursors.

4. A computer readable memory as claimed in claim 3 wherein each of the rulers includes an inner region and the angle is formed between the inner regions.

5. A method for processing first image data representing a first image with a computer that is connected to a display and a pointing device, the method comprising the steps of:
generating second image data representing a second image of the first image and an angle measuring tool projected on the first image in response to the first image data, the angle measuring tool including endpoint cursors that can be manipulated with the pointing device to position the angle measuring tool on the first image to form an angle;
measuring the formed angle;
generating angle data representing angle information about the measured angle;
formatting the second image data for display of the second image;
formatting the angle data for display of the angle information; and
displaying the second image on the display in response to the formatted second image data; and
displaying the angle information on the display in response to the formatted angle data.

6. A method as claimed in claim 5 wherein the endpoint cursors magnify the first image therearound to enable accurate positioning of the endpoint cursors.

7. A method as claimed in claim 5 wherein the angle measuring tool comprises two rulers that each comprise two of the endpoint cursors and are joined at and share one of the endpoint cursors.

8. A method as claimed in claim 7 wherein each of the rulers includes an inner region and the angle is formed between the inner regions.

* * * * *